(12) United States Patent
Wong et al.

(10) Patent No.: US 7,575,735 B2
(45) Date of Patent: Aug. 18, 2009

(54) METAL OXIDE AND METAL FLUORIDE NANOSTRUCTURES AND METHODS OF MAKING SAME

(75) Inventors: Stanislaus S. Wong, Stony Brook, NY (US); Yuanbing Mao, Los Angeles, CA (US)

(73) Assignee: The Research Foundation of State University of New York, Albany, NY (US)

( * ) Notice: Subject to any disclaimer, the term of this patent is extended or adjusted under 35 U.S.C. 154(b) by 251 days.

(21) Appl. No.: 11/592,704

(22) Filed: Nov. 2, 2006

(65) Prior Publication Data

US 2007/0113779 A1  May 24, 2007

Related U.S. Application Data

(60) Provisional application No. 60/733,010, filed on Nov. 2, 2005.

(51) Int. Cl.
| | |
|---|---|
| C01F 1/00 | (2006.01) |
| C01F 5/00 | (2006.01) |
| C01F 11/00 | (2006.01) |
| C01G 1/00 | (2006.01) |
| C01G 3/00 | (2006.01) |
| C01G 9/00 | (2006.01) |
| C01G 11/00 | (2006.01) |
| C01G 21/00 | (2006.01) |
| C01G 37/14 | (2006.01) |
| C01G 41/02 | (2006.01) |
| C01G 45/00 | (2006.01) |
| C01G 49/00 | (2006.01) |
| C01G 51/00 | (2006.01) |
| C01G 53/00 | (2006.01) |
| C01G 57/00 | (2006.01) |

(52) U.S. Cl. .............. 423/593.1; 423/518; 423/554; 423/555; 423/557; 423/558; 423/559; 423/594.1; 423/594.13; 423/594.14; 423/594.16; 423/594.3; 423/594.5; 423/595; 423/599; 977/773; 977/811; 977/812; 977/895

(58) Field of Classification Search ........... 423/594.13, 423/594.16, 595, 596, 518, 554, 555, 557, 423/558, 559, 593.1, 594.14, 599; 502/305, 502/306, 340; 977/773, 811, 812, 895
See application file for complete search history.

(56) References Cited

OTHER PUBLICATIONS

A. Fernandez-Gonzalez et al., Crystallisation of Ba(SO4, CrO4) solid solutions from aqueous solutions, 1999, Journal of Crystal Growth, 200, 227-235.*
Rao et al, Inoranic nanowires, 2003, Progress in Solid State Chemistry, 31, 5-147.*
Shi et al., Polymer-Directed Synthesis of Penniform BaWO4 Nanostructures in Reverse Micelles, 2003, JACS Communications, 125, 3450-3451.*
Wu et al., *Chem. Eur. J.*, 2002, 8, 1260-1268.
Hu et al., *Acc. Chem. Res.*, 1999, 32, 435-445.
Peng et al., *J. Am. Chem. Soc.*, 2002, 124, 3343-3353.

(Continued)

*Primary Examiner*—Timothy C Vanoy
*Assistant Examiner*—Serena L Hanor
(74) *Attorney, Agent, or Firm*—Hoffmann & Baron, LLP

(57) ABSTRACT

The present invention includes pure single-crystalline metal oxide and metal fluoride nanostructures, and methods of making same. These nanostructures include nanorods and nanoarrays.

20 Claims, 16 Drawing Sheets

OTHER PUBLICATIONS

Puntes et al., *Science*, 2001, 291, 2115-2117.
Limmer et al., *Adv. Mater.*, 2001, 13, 1269-1272.
Ginzburg-Margau et al., *Chem. Commun.*, 2002, (24), 3022-3023.
Rao et al., *J. Chem. Soc., Dalton Trans.*, 2003, (1), 1-24.
Qi et al., *J. Phys. Chem. B*, 1997, 101, 3460-3463.
Kwan et al., *Chem. Commun.*, 2001, (5), 447-448.
Krumeich et al., *J. Am. Chem. Soc.*, 1999, 121, 8324-8331.
Wang et al., *Chem. Commun.*, 2001, (8), 727-728.
Liao et al., *Chem. Mater.*, 2000, 12, 2819-2821.
Sun et al., *Chem. Commun.* 2003, 1768-1769.
Cao et al., *J. Am. Chem. Soc.* 2003, 125, 11196-11197.
Huang et al., *Mater. Lett.* 2005, 59, 430-433.
Agnoli et al., *Adv. Mater.* 2001, 13, 1697-1699.
Shi et al., *Adv. Mater.*, 2003, 15, 1647-1651.
Shi et al., *Chem. Commun.*, 2002, (16), 1704-1705.
Lakshmi et al., *Chem. Mater.*, 1997, 9, 857-862.
Limmer et al., *Adv. Funct. Mater.*, 2002, 12, 59-64.
Schmid, G., *J. Mater. Chem.*, 2002, 12, 1231-1238.
Hulteen et al., *J. Mater. Chem.*, 1997, 7, 1075-1087.
Colfen et al., *Angew. Chem. Int. Ed.*, 2003, 42, 2350-2365.
Huang et al., *Science*, 2001, 292, 1897-1899.
Yang, P., *Nature*, 2003, 425, 243-244.
Feng et al., *J. Am. Chem. Soc.*, 2004, 126, 62-63.
Tian et al., *Nat. Mater.*, 2003, 2, 821-826.
Tian et al., *J. Am. Chem. Soc.*, 2003, 125, 12384-12385.

* cited by examiner

PC Membrane

METAL OXIDE AND METAL FLUORIDE NANOSTRUCTURES AND METHODS OF MAKING SAME

CROSS-REFERENCE TO RELATED APPLICATION

This application claims the benefit of U.S. Provisional Application No. 60/733,010, filed Nov. 2, 2005, which is incorporated herein by reference in its entirety.

This invention was made with support by the US Department of Energy under contract number DE-AC02-98CH10886 and the National Science Foundation under CAREER award DMR-0348239. The Government has certain rights in this invention.

BACKGROUND OF THE INVENTION

Nanoscale structures, such as nanoparticles, nanorods, nanowires, nanocubes, and nanotubes, have attracted extensive synthetic attention as a result of their novel size-dependent properties (Xia et al., *Adv. Mater.*, 2003, 15, 353; Patzke et al., *Angew. Chem. Int. Ed.*, 2002, 41, 2446; Wu et al., *Chem. Eur. J.*, 2002, 8, 1260; Tremel, W., *Angew. Chem. Int. Ed.*, 1999, 38, 2175; Tenne, R., *Chem. Eur. J.*, 2002, 8, 5296; Rao et al., *J. Mater. Chem.*, 2001, 11, 2887; and Rao et al., *J. Chem. Soc., Dalton Trans.*, 2003, (1), 1). In particular, one-dimensional (1-D) materials (e.g., nanorods) with their inherent anisotropy are the smallest dimension structures that can be used for efficient transport of electrons and optical excitations. As such, they are applicable as building blocks to assemble the next generation of molecular electronic and computational devices.

Part of the challenge of developing practical nanoscale devices for a variety of applications, including energy storage, fuel cells, and sensing, is the ability to conveniently synthesize well-characterizable, single-crystalline nanostructures in order to rationally exploit their nanoscale optical, electronic, thermal, and mechanical properties (Rao et al., *J. Mater. Chem.*, 2001, 11, 2887; Duan et al., *Nature*, 2001, 409, 66; Rueckes et al., *Science*, 2000, 289, 94; and Gao et al., *Nature*, 2002, 415, 599).

Ideally, the net result of nanoscale synthesis is the production of structures that achieve monodispersity, stability, and crystallinity with a predictable morphology. Many of the synthetic methods used to attain these goals have been based on principles derived from semiconductor technology, solid state chemistry, and molecular inorganic cluster chemistry.

Strategies for the preparation of 1-D nanowires, for example, rely on the formation from a confined alloy droplet, as described by the vapor-liquid-solid (VLS) mechanism (Wu et al., *Chem. Eur. J.*, 2002, 8, 1260 and Hu et al., *Acc. Chem. Res.*, 1999, 32, 435), the kinetic control of growth through the use of capping reagents (Peng et al., *J. Am. Chem. Soc.*, 2002, 124, 3343 and Puntes et al., *Science*, 2001, 291, 2115), the generation through a low temperature, chimie douce solution chemical methodology Limmer et al., *Adv. Mater.*, 2001, 13, 1269 and Ginzburg-Margau et al., *Chem. Commun.*, 2002, (24), 3022).

Metal oxides and metal fluorides, in particular, represent two of the most diverse classes of materials, with important structure-related properties, including superconductivity, ferroelectricity, magnetism, conductivity, and gas sensing capabilities (Smart et al. *Solid State Chemistry;* 2nd ed.; Chapman & Hall: New York, 1995 and West, A. R. *Basic Solid State Chemistry;* 2nd ed.; John Wiley & Sons: New York, 1999).

Prior art methods of synthesizing oxide nanostructures are by heating and calcination of precursors (Rao et al., *J. Chem. Soc., Dalton Trans.*, 2003, (1), 1); reversed micelle templating techniques (Qi et al., *J. Phys. Chem. B*, 1997, 101, 3460 and Kwan et al., *Chem. Commun.*, 2001, (5), 447); sol-gel processes (Krumeich et al., *J. Am. Chem. Soc.*, 1999, 121, 8324); surfactant-mediated steps (Wang et al., *Chem. Commun.*, 2001, (8), 727); and hydrothermal procedures (Liao et al., *Chem. Mater.*, 2000, 12, 2819).

Prior art methods of synthesizing fluoride nanostructures are by hydrothermal/solvothermal method or reverse micelle method (Sun et al., *Chem. Commun.* 2003, 1768; Cao et al., *J. Am. Chem. Soc.* 2003, 125, 11196; Huang et al., *Mater. Lett.* 2005, 59, 430 and Agnoli et al., *Adv. Mater.* 2001, 13, 1697).

However, these prior art methods have substantial shortcomings. Most significantly, the prior art methods do not allow for the synthesis of pure, single-crystalline nanostructures with predictable size and morphology.

For example, although a few prior art methods allow for the synthesis of nanorods with a high aspect ratio, these methods do not yield pure nanostructures. In particular, these methods use organic surfactants in their processes for making nanostructures. (Shi et al., *Adv. Mater.*, 2003, 15, 1647 and Shi et al., *Chem. Commun.*, 2002, (16), 1704.) Thus, the resultant nanostructures have organic surfactant molecular groups, such as bis(2-ethylhexyl)sulphosuccinate, undecylic acid, decylamine, or double-hydrophilic block copolymers, present on their surfaces.

Additionally, the prior art methods do not enable the synthesis of single-crystalline nanostructures. For example, in spite of the variety of different deposition strategies used in the prior art, including electrochemical deposition, electroless deposition, polymerization, sol-gel deposition, and layer-by-layer deposition in nanoporous templates, the resultant nanostructures are polycrystalline. The reason for the observed polycrystallinity is that these prior methods require additional annealing steps at high temperature. (Lakshmi et al., *Chem. Mater.*, 1997, 9, 857; Limmer et al., *Adv. Funct. Mater.*, 2002, 12, 59; Schmid, G., *J. Mater. Chem.*, 2002, 12, 1231; and Hulteen et al., *J. Mater. Chem.*, 1997, 7, 1075.)

Moreover, the prior art methods do not enable the reproducible fabrication of ordered, monodisperse 3-D arrays of 1-D nanomaterials. Such fabrication is critical because assembly of nanoscale components is a key for building functional devices, important for applications including nanoscale electronics and molecular sensing (Colfen et al., *Angew. Chem. Int. Ed.*, 2003, 42, 2350). Specifically, the fabrication of 3-D arrays of nanorods would be useful for optoelectronic applications, such as room-temperature ultraviolet lasing (Huang et al., *Science*, 2001, 292, 1897). Though a number of preparative methods have been reported for generating these types of nanoscale architectures, none of these techniques appears to work for metal oxides and fluorides (Yang, P., *Nature*, 2003, 425, 243; Feng et al., *J. Am. Chem. Soc.*, 2004, 126, 62; Tian et al., *Nat. Mater.*, 2003, 2, 821; and Tian et al., *J. Am. Chem. Soc.*, 2003, 125, 12384).

Furthermore, the prior art methods require complex fabrication processes and high temperatures to yield nanostructures.

Accordingly, there remains a need for a low temperature and simplistic method of synthesizing pure single-crystalline nanostructures which allows for controlling the size, in particular the aspect ratio; the extent of monodispersity; and morphology of the resultant nanostructures.

SUMMARY OF THE INVENTION

The present invention includes pure single-crystalline metal oxide and metal fluoride nanostructures. These nanostructures include nanorods and nanoarrays. The nanostructures are at least about 80%, 90%, 95%, 99% or 100% free of defects and/or dislocations.

The nanorods have an aspect ratio of from about 2 up to about 1000. More typically, the aspect ratio is about 15. The diameter of the nanorod ranges from about 1 to about 10,000 nm, more typically from about 2 nm to about 2 µm. The length of the nanorod ranges from about 20 nm to about 20 µm, more typically about 10 µm.

In one embodiment, the present invention includes single crystalline nanorods with the chemical formula of $ABO_4$. A is Ba, Sr, Pb, Ca, Fe, Mn, Co, Ni, Cu, Zn, Cd, Mg, and mixtures of thereof. B is W, Cr, Mo, S, I, Se, and mixtures thereof. The present invention includes nanostructures which consist essentially of the $ABO_4$ compounds.

In another embodiment, the present invention includes single crystalline nanorods with the chemical formula of $DEF_3$. D is Na, K, Li, Rb, Ce, and their mixtures. E is a transitional metal, Ca, Mg, Ba, Sr, Pb or mixtures of the aforementioned elements. Transitional metals include Mn, Zn, Cd, Fe, Co, and Ni. The present invention includes nanostructures which consist essentially of the $DEF_3$ compounds.

In a further embodiment, the present invention includes single crystalline nanorods with the chemical formula of $GF_2$. G is selected from the group consisting of Mg, Ca, Sr, Ba, Mn, Zn, Cd, Fe, Co, Ni, and their mixtures. The present invention includes nanostructures which consist essentially of the $GF_2$ compounds.

In other embodiment of the present invention, the $DEF_3$ and $GF_2$ nanostructures are doped with trivalent rare earth ions.

In another aspect, the present invention includes nanoarray comprising a plurality of single crystalline nanorods wherein the chemical formula of the nanorods is $ABO_4$, $DEF_3$, or $GF_2$, as described above. Preferably, the nanoarrays are at least 50%, 60%, 70%, 80%, 90%, 95%, 99% or virtually completely monodisperse.

In a further aspect, the present invention includes a method of producing single crystalline nanostructures (e.g., nanorods) with the chemical formula of $ABO_4$, $DEF_3$, or $GF_2$. The method comprises providing a first reagent solution and providing a second reagent solution; placing a porous membrane between the first reagent solution and the second agent solution, thereby producing single crystalline nanostructures. Preferably, the production takes place at room temperature. In one embodiment, the first reagent solution comprises a salt of A; and the second reagent solution comprises a salt of B. In another embodiment, the first reagent solution comprises a fluoride of D; and the second reagent solution comprises a salt of E. In an additional embodiment, the first reagent solution comprise a salt of G; and the second reagent solution is ammonia fluoride or lithium fluoride.

Examples of porous membranes include "track-etch" polymeric membranes; copolymer templates; porous alumina or silica membranes; and TEFLON® membranes. Preferably, the method comprises a double-diffusion set-up.

In one aspect of the present invention, the method further comprises controlling the dimensions and morphology of the nanostructures (e.g., nanorods and nanoarrays).

In another aspect, the present invention provides devices comprising at least one single crystalline nanorod described above. Examples of the devices include sensors, a device used in molecular electronics, a device used in optoelectronics, and scanning probe microscopy tips.

The present invention overcomes many of the shortcomings of the prior art. For example, unlike the prior art methods, the present invention enables the synthesis of pure single-crystalline, monodisperse, stable (including thermally stable) nanostructures at room temperature. Another key advantage of the invention includes enabling the synthesis of nanostructures of a predictable size, shape, chemical composition, and morphology. The chemical and physical properties of template membranes (i.e., pore geometry and monodisperse diameters) enable a high degree of control over the dimensions of the resulting nanostructures.

A further advantage of the present method is that these nanostructures can be assembled into an architecture suitable for nanoscale electronics and molecular sensing. Specifically, the invention allows for the fabrication of nanoarrays in a predictable and reproducible manner. Such nanoarrays are useful for optoelectronic applications, such as room-temperature ultraviolet lasing.

DETAILED DESCRIPTION OF THE INVENTION

Figure 1:
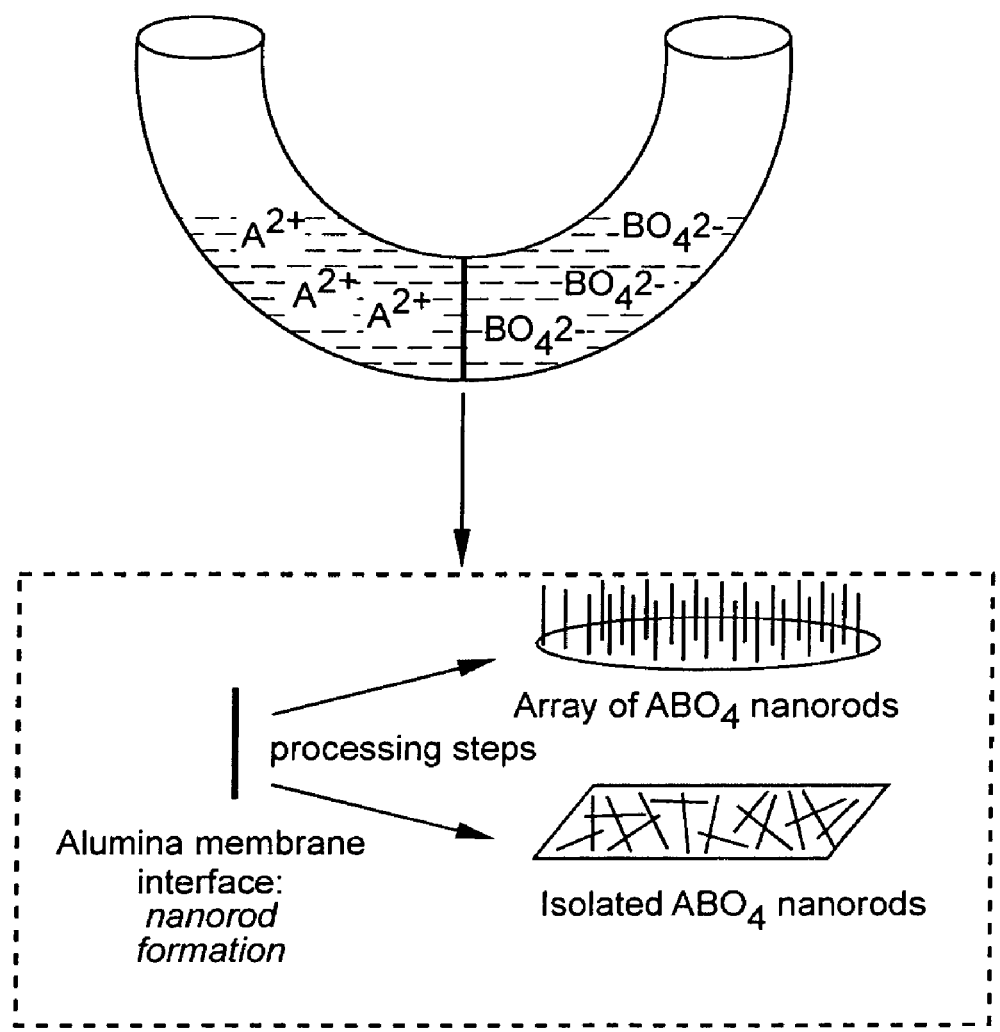
FIG. 1. Schematic of setup used to synthesize $ABO_4$ nanostructures, such as $BaWO_4$ and $BaCrO_4$ nanorods.

The present invention relates to the field of nanotechnology, including nanostructures and their applications.

The present invention includes metal oxide and metal fluoride single crystalline nanostructures. These nanostructures include free-standing nanorods and include nanoarrays comprising a plurality of such nanorods. For the purposes of this specification, the term nanorod(s) is synonymous with nanowire(s). The invention also includes methods of making such nanostructures. In particular, the methods enable the making of nanostructures with predictable size and morphology. The methods comprise the use of template membranes and proceed at room temperature.

Nanostructures with the Chemical Formula of $ABO_4$

In one embodiment of the present invention, the nanostructures have the chemical formula of $ABO_4$. A and B represent two different metallic elements with oxidation states of +2 and +6, respectively.

A can be an alkaline earth metal or a transitional metal. A can be, for example, barium (Ba), strontium (Sr), lead (Pb), calcium (Ca), iron (Fe), manganese (Mn), cobalt (Co), nickel (Ni), copper (Cu), zinc (Zn), cadmium (Cd), magnesium (Mg), or mixtures thereof. An example of a mixture is $Ba_{1-x}Sr_x$, wherein x is $0 \leq x \leq 1$.

B can be, for example, tungsten (W), chromium (Cr), molybdenum (Mo), sulfur (S), iodine (I), selenium (Se), and mixtures thereof. An example of a mixture is $W_{1-x}Cr_x$, wherein x is $0 \leq x \leq 1$.

In the methods of making nanostructures with the formula $ABO_4$, any compound comprising A and any compound comprising B can be used as reagents, hereinafter termed "A-reagent" and "B-reagent," repectively. These reagents are soluble in aqueous solvents.

Examples of A-reagents Include:

Ba(barium): acetate (Ba$(CH_3CO_2)_2$); halides, such as bromide ($BaBr_2$), chloride ($BaCl_2$), and iodide ($BaI_2$); hydroxide ($Ba(OH)_2$); nitrate ($Ba(NO_3)_2$); oxalate ($BaC_2O_4$); perchlorate ($Ba(ClO_4)_2$); etc.

Sr(strontium): acetate ($Sr(CH_3CO_2)_2$); halides, such as chloride ($SrCl_2$), bromide ($SrBr_2$) and iodide ($SrI_2$); hydroxide ($Sr(OH)_2$); nitrate ($Sr(NO_3)_2$); oxalate ($SrC_2O_4$); perchlorate ($Sr(ClO_4)_2$); etc.

Ca(calcium): acetate ($Ca(CH_3CO_2)_2$); halides, such as chloride ($CaCl_2$), bromide ($CaBr_2$) and iodide ($CaI_2$); hydroxide ($Ca(OH)_2$); nitrate ($Ca(NO_3)_2$); oxalate ($CaC_2O_4$); perchlorate ($Ca(ClO_4)_2$); etc.

Fe(iron): acetate ($Fe(CH_3CO_2)_2$); halides, such as bromide ($FeBr_2$), chloride ($FeCl_2$), and iodide ($FeI_2$); nitrate ($Fe(NO_3)_2$), etc.

Mn(manganese): acetate ($Mn(CH_3CO_2)_2$); halides, such as bromide ($MnBr_2$), chloride ($MnCl_2$), and iodide ($MnI_2$); nitrate ($Mn(NO_3)_2$), etc.

Co(cobalt): acetate ($Co(CH_3CO_2)_2$); halides, such as bromide ($CoBr_2$), chloride ($CoCl_2$), and iodide ($CoI_2$); nitrate ($Co(NO_3)_2$), etc.

Ni(nickel): acetate ($Ni(CH_3CO_2)_2$); halides, such as bromide ($NiBr_2$), chloride ($NiCl_2$), and iodide ($NiI_2$); nitrate ($Ni(NO_3)_2$), etc.

Cu(copper): acetate ($Cu(CH_3CO_2)_2$); halides, such as bromide ($CuBr_2$), chloride ($CuCl_2$), and iodide ($CuI_2$); nitrate ($Cu(NO_3)_2$), etc.

Zn(zinc): acetate Zn$(CH_3CO_2)_2$; halides, such as bromide ($ZnBr_2$), chloride ($ZnCl_2$), fluoride ($ZnF_2$), and iodide ($ZnI_2$); lactate Zn$[CH_3CH(OH)CO_2]_2$; nitrate ($Zn(NO_3)_2$); oxalate ($ZnC_2O_4$); perchlorate ($Zn(ClO_4)_2$); sulfate ($ZnSO_4$); etc.

Mg(magnesium): acetate ($Mg(CH_3CO_2)_2$); halides, such as bromide (MgBr2), chloride ($MgCl_2$), and iodide (MgI2); nitrate (Mg(NO3)2), etc.

Pb (lead): acetate; halides, such as, bromide, chloride, and iodide; nitrate, etc.

Cd (cadmium): acetate; halides, such as, bromide, chloride, and iodide; nitrate, etc.

Two or more A-reagents can be used to make a mixed A-reagent. For example, a mixed A-reagent can comprise barium chloride and strontium chloride, which can form nanostructures of the formula $(Ba_{1-x}Sr_x)BO_4$, wherein x is $0 \leq x \leq 1$.

Examples of B-reagents include:

W(tungsten): $Na_2WO_4$; $K_2WO_4$; $Li_2WO_4$; $(NH_4)_2WO_4$; oxychloride ($WOCl_4$); rubidium tungstate; cesium tungstate; etc.

Cr(chromium): $Na_2CrO_4$; $K_2CrO_4$; $Li_2CrO_4$; $(NH_4)_2CrO_4$; oxychloride ($CrOCl_4$); etc.

Mo(molybdenum): $Na_2MoO_4$; $K_2MoO_4$; $Li_2MoO_4$; $(NH_4)_2MoO_4$; oxychloride ($MoOCl_4$); etc.

S (sulfur): $Na_2SO_4$; $K_2SO_4$; $Li_2SO_4$; $(NH_4)_2SO_4$; oxychloride ($SOCl_4$); etc.

I (iodine): $Na_2IO_4$; $K_2IO_4$; $Li_2IO_4$; $(NH_4)_2IO_4$; oxychloride ($IOCl_4$); etc.

Se (selenium): $Na_2SeO_4$; $K_2SeO_4$; $Li_2SeO_4$; $(NH_4)_2SeO_4$; oxychloride ($SeOCl_4$); etc.

Two or more B-reagents can be used to make a mixed B-reagent. For example, a mixed B-reagent can comprise sodium tungstate and sodium chromate which can form nanostructures of $A(W_{1-x}Cr_x)O_4$ wherein x is $0 \leq x \leq 1$.

Specific examples of $ABO_4$ compounds include, but are not limited to, $BaWO_4$, $BaCrO_4$, $SrWO_4$, $BaMoO_4$, $ZnWO_4$, $CaWO_4$, $MgWO_4$, $CaCrO_4$, $MgCrO_4$, $BaSO_4$, $BaIO_4$, $Ba_{1-x}Sr_xWO_4$, etc.

Nanostructures with the Chemical Formula of $DEF_3$.

In another embodiment of the present invention, the nanostructures have the chemical formula of $DEF_3$.

D can be, for example, sodium (Na), potassium (K), lithium (Li), rubidium (Rb), cesium (Ce), and their mixtures. An example of a mixture is $Na_{1-x}K_x$, wherein x is $0 \leq x \leq 1$.

E can be an alkaline earth metal or a transitional metal. E can be, for example, calcium (Ca), magnesium (Mg), barium (Ba), strontium (Sr), lead (Pb), manganese (Mn), zinc (Zn), cadmium (Cd), iron (Fe), cobalt (Co), nickel (Ni), copper (Cu) or mixtures thereof. An example of a mixture is $Mn_{1-x}Zn_x$, wherein x is $0 \leq x \leq 1$.

In the methods of making nanostructures with the formula $DEF_3$, any compound comprising D and any compound comprising E can be used as reagents, hereinafter termed "D-reagent" and "E-reagent," respectively. These reagents are soluble in aqueous solvents.

Examples of D-reagents include: sodium fluoride, potassium fluoride, lithium fluoride, rubidium fluoride, cesium fluoride, and their mixtures.

Two or more D-reagents can be used to make a mixed D-reagent. For example, a mixed D-reagent can comprise sodium fluoride and potassium fluoride, which can form nanostructures of the formula $(Na_{1-x}K_x)EF_3$, wherein x is $0 \leq x \leq 1$.

Examples of E-reagents include: acetates, hydroxides, percholates, oxalates, nitrates and halides, such as chloride and bromide, of Mn, Pb, Zn, Cd, Fe, Co, Ni, Ba, Sr, Ca, Mg, Cu and their mixtures.

Two or more E-reagents can be used to make a mixed E-reagent. For example, an mixed E-reagent can comprise manganese nitrate and zinc nitrate, which can form nanostructures of the formula $D(Mn_{1-x}Zn_x)F_3$, wherein x is $0 \leq x \leq 1$.

Some specific examples of $DEF_3$ compounds include $KMnF_3$, $NaMnF_3$, $KZnF_3$, $KCdF_3$, etc.

In an alternative embodiment, the nanostructures with the chemical formula of $DEF_3$ are doped with trivalent rare earth ions to form nanostructures with the chemical formula of $DE_{1-y}F_{3-4}$: $Re_y$, wherein y is $0 \leq y \leq 1$ (when y is 1, then the formula is $DReF_4$). Re is selected from the lanthanide or actinide series. The lanthanide series includes La, Ce, Pr, Nd, Pm, Sm, Eu, Gd, Tb, Dy, Ho, Er, Tm, Yb and Lu. The actinide series includes Ac, Th, Pa, U, Np, Pu, Am, Cm, Bk, Cf, Es, Fm, Md, No and Lr.

Any compound comprising Re can be used as a "Re-reagent." Preferred examples of Re-reagents include nitrates and halides, such as chloride and bromide, of the lanthanides and actinides, and their mixtures, for example, $Nd(NO_3)_3$, $Nd(OAc)_3$, $Er(NO_3)_3$, $Ho(NO_3)_3$, etc.

Two or more Re-reagents can be used to make a mixed Re-reagent. For example, a mixed Re-reagent can comprise erbium nitrate and holmium nitrate, which can form nanostructures of the formula $DE_{1-y}F_{3-4}$: $(Er_{1-x}Ho_x)_y$, wherein x is $0 \leq x \leq 1$ and y is $0 \leq y \leq 1$ (when x is 1, and y is 1, then the formula is $DHoF_4$).

Nanostructures with the Chemical Formula of $GF_2$.

In a further embodiment of the present invention, the nanostructures have the chemical formula of $GF_2$.

G can be an alkaline earth metal, a transitional metal or other metals. For example, G can be Mg, Ca, Sr, Ba, Mn, Zn, Cd, Fe, Co, Ni, Pb, Cu or mixtures thereof. An example of a mixture is $Ba_{1-x}Ca_x$, wherein x is $0 \leq x \leq 1$.

In the methods of making nanostructures with the formula $GF_2$, any compound comprising G can be used as a reagent, hereinafter termed "G-reagent." A reagent comprising fluoride is ammonia fluoride or lithium fluoride. These reagents are soluble in aqueous solvents.

Examples of G-reagents include: acetates, hydroxides, percholates, oxalates, nitrates and halides, such as chloride and bromide, of Ba, Sr, Mn, Zn, Cd, Fe, Co, Ni, Ca, Mg, Pb, Cu and their mixtures.

Two or more G-reagents can be used to make a mixed G-reagent. For example, an mixed G-reagent can comprise barium nitrate and calcium nitrate, which can form nanostructures of the formula $(Ba_{1-x}Ca_x)F_2$, wherein x is $0 \leq x \leq 1$.

Some specific examples of $GF_2$ compounds include $BaF_2$, $SrF_2$, $CaF_2$, $MgF_2$, etc.

In an alternative embodiment, the nanostructures with the chemical formula of $GF_2$ are doped with trivalent rare earth ions to form nanostructures with the chemical formula of $G_{1-y}F_{2-3}$: $Re_y$, wherein y is $0 \leq y \leq 1$ (when y is 1, the formula is $F_3Re$). Re is selected from the lanthanide or actinide series, as defined above. Any compound comprising Re can be used as a "Re-reagent," as defined above.

Two or more Re-reagents can be used to make a mixed Re-reagent. For example, an mixed Re-reagent can comprise erbium nitrate and holmium nitrate, which can form nanostructures of the formula $G_{1-y}F_{2-3}$: $(Er_{1-x}Ho_x)_y$, wherein x is $0 \leq x \leq 1$ and y is $0 \leq y \leq 1$ (when x is 1 and y is 1, then the formula is $HoF_3$).

Methods of Making the Nanostructures

An A-reagent and B-reagent, or a D-reagent and E-reagent, or a G-reagent and ammonia/lithium fluoride are each placed into separate aqueous solvents to form reagent solutions. Accordingly, different ions form in each of the different solutions, i.e., $A^{2+}$; $(BO_4)^{2-}$; $D^+F^-$; $E^{2+}$; $G^{2+}$ or $F^-$ form in each of the solutions.

In the alternative embodiment wherein the E-reagent or G-reagent is doped with a Re-reagent, an Re-reagent is added to the E-reagent or to the G-reagent. In this embodiment, the ions formed in solution are $DF^-$ and $E^{2+}$ along with $Re^{3+}$; or $F^-$ and $G^{2+}$ along with $Re^{3+}$.

The concentrations of the two selected reagent solutions range from being equivalent (i.e., equimolar) to where one solution is twice or thrice as concentrated as the other.

Examples of suitable aqueous solvents include water; alkyl and alkylene glycols, such as, for example, ethylene glycol; mixtures of water and alcohols (methanol, ethanol, isopropanol, butanol, pentanol, hexanol); mixtures of water and acids, such as, for example, acetic acid, sulfuric acid, phosphoric acid, propionic acid, ethanoic acid, and/or nitric acid; and mixtures of ethylene glycol and acids, such as, for example, citric acid and/or tartaric acid. Solvents are selected according to the particular reagents used as would be known to a skilled artisan.

The two selected reagent solutions are then placed in contact with each other in a manner which allows production of single crystals. Reactions can be run at any temperature that is between the melting and boiling points of the solvents. Preferably, the reaction is run at room temperature. The reagent solutions are placed into contact with each other at a slow rate. Preferably, the reagent solutions are placed into two reservoirs separated from each other by a template membrane.

An example of a set-up which allows for such a slow rate of contact of reagent solutions is a double-diffusion set-up. See FIG. 1. In this set-up, a different reagent solution is placed into either half of a U-tube cell separated by a template membrane. For the growth of $ABO_4$ nanostructures, an A-reagent solution is on one side and a B-reagent solution is on the other side. For the growth of $DEF_3$ nanostructures, a D-reagent solution is on one side and an E-reagent solution is on the other side. For the growth of $DE_{1-y}F_{3-4}$: $Re_y$ nanostructures, a D-reagent solution is on one side and an E-agent+Re-reagent solution is on the other side. For the growth of $GF_2$ nanostructures, a G-reagent solution is on one side, and a solution of ammonia fluoride or of lithium fluoride is on the other side. For the growth of $Re_y$: $G_{1-y}F_{2-3}$ nanostructures, a G-reagent+Re-reagent solution is on one side, and a solution of ammonia fluoride or of lithium fluoride is on the other side.

A double diffusion crystallization set-up process is described in Park et al., *Adv. Mater.*, 2002, 14, 1167; Park et al., *J. Mater. Chem.*, 2004, 14, 2291; and Peters et al., M., *J. Chem. Soc., Dalton Trans.*, 2001, 24, 358, all of which is incorporated herein by reference.

The reagent solutions flow into the membrane pores. The membrane slows down the rate of contact of the ions of the reagents. When the two ions meet, crystallization occurs thereby forming nanorods within the membrane pores. The nucleation and growth of crystalline nanorods occur essentially instantaneously through the direct chemical interaction between ions of the two different reagent solutions.

Although not wanting to be limited by a mechanism, it is believed that the formation mechanism of nanorods of the present invention is analogous to a biomimetic crystallization process (Dorozhkin et al., *Cryst. Growth Des.*, 2004, 4, 389). That is, the growth of nanorods within the confinement of a template membrane is analogous to the precipitation of single crystals of calcium carbonate and calcium phosphate within the confinement offered by gels, micelles, chitin scaffolds, and collagen matrices. The interactions between the reagent molecules are likely stronger than those between the reagent molecules and the pore walls. The nucleation rate is primarily dictated by the supersaturation of the solution.

Single crystals of nanoscale materials derive from isolated, disparate nucleation sites (consisting of $ABO_4$, $DEF_3$ or $GF_2$ (or their rare-earth doped species) nuclei generated via the reaction between their respective ions), which then grow by extension through the porous network. Continued growth then occurs at the crystal surface at a rate limited by ion availability, until the crystal impinges on the template surface, which ultimately limits further growth.

The reagents are in contact until the desired growth is achieved, e.g., from about 1 h to about 100 hrs, more typically from about 2 hrs to about 24 hrs. The membrane is then removed.

In the methods of making free-standing nanorods, the membranes can be removed from the resultant nanorods by immersion in a base solution as would be known by a skilled artisan. For example, the membranes can be removed by immersion in NaOH solution at room temperature. Thereafter, to retrieve free-standing nanostructures, the base solution is diluted in several steps with distilled water and an organic solvent. Free-standing nanostructures are then collected by centrifugation or filtration, as would be known by a skilled artisan.

In the methods of making nanoarrays, a membrane containing a nanoarray is attached to a substrate to form a composite, as would be known by a skilled artisan. The nanoarray can be attached, for example, by glue, or by vacuum or sputtering coating one side of the membrane containing nanorods with a thin film of substrates. An example of a glue is Epoxy resin. Examples of substrates include a paper towel, gold, polymeric thin films graphite, mica, silica, silicon, wood, glass, alumina, metal, and metal oxide.

The resulting composite is immersed into an aqueous base solution (e.g., NaOH aqueous solution) until the membrane is dissolved (e.g., for about 15 minutes to about 2 hrs). A nanoarray protruding out from the surface of the substrate is obtained. Preferably, the nanoarray is washed with distilled, deionized water and air-dried.

The methods of the present invention do not require that the resultant nanostructures be annealed.

Purity of Nanostructures

The nanostructures of the invention are crystalline and solid. Preferably, the nanostructures are at least 95%, more preferably at least 99%, and most preferably virtually completely free of defects and/or dislocations. As defined in this specification, defects are irregularities in the crystal lattice. Some examples of defects include a non-alignment of crystallites, an orientational disorder (e.g., of molecules or ions), vacant sites with the migrated atom at the surface (Schottky defect), vacant sites with an interstitial atom (Frenkel defects), and non-stoichiometry of the crystal. An example of a dislocation is a line defect in a crystal lattice.

Additionally, the nanostructures are free of organic surfactant molecular groups (including nonionic surfactants, cationic surfactants, and anionic surfactants), such as bis(2-ethylhexyl)sulphosuccinate, undecylic acid, sodium dodecyl sulfate (SDS), Triton X-100, decylamine, or double-hydrophilic block copolymers, which are present on the surfaces of prior art nanostructures.

Methods of Controlling the Dimensions and Morphology of Nanostructures

The dimensions and morphology of the resultant nanostructures are controlled by the structure of the template membranes within which the nanostructures are grown. The membranes act to spatially direct crystal growth.

The nanostructures grow within membrane pores. The pore sizes of the membranes are varied according to the desired diameters of the resultant nanostructures. For example, the diameters of the pores can range from about 1 nm to about 100 μm, preferably from about 3 nm to about 2 μm, more preferably from about 20 nm to several hundred nanometers. A resultant nanorod typically has approximately the same diameter as the size of the pore within which it was grown. For example, using a membrane with 200 nm pores produces nanorods having diameters in the range of 190 to 210 nm. Typically, the diameter is uniform throughout the length of a nanorod.

The thicknesses of the membranes are varied according to the desired lengths of the nanostructures. The thickness of a membrane corresponds with the length of a resultant nanorod. Accordingly, the maximum length of a nanorod is limited by the thickness of a membrane. Membranes typically range from approximately about 20 nm to about 20 μm, more typically from about one to about five microns, in thickness. Accordingly, nanostructures have the same range of lengths.

Aspect ratio, as defined in the present specification, is the ratio of length to width (i.e., diameter). The aspect ratio of a nanorod of the present invention can range from about 2 to about 1000, more typically from about 5 to about 50, and most typically from about 10 to about 25.

The width of an array corresponds with the width of the membrane on which the array was grown. The length of an array corresponds with the thickness of the membrane. The nanorods of an array can be monodisperse by using a membrane with uniform pores. Alternatively, the nanorods of an array can be polydisperse by using a membrane with a variety of different pore sizes.

Additionally, the distances between each individual nanorod within an array is controlled by varying the pore densities on the membranes. All other parameters being equal, the more dense the porosity of a membrane, the closer each individual nanorod is to each other. Alternatively, the pores on the membrane can be placed in such a fashion that they are not at a uniform distance from each other.

Although within a nanoarray the nanorods are individually separated from each other, they form a dense, continuous network. Preferably, the nanorods are roughly parallel to each other and vertically oriented on the substrates to form a packed array, stretching over micron-sized areas.

The shapes of the nanorods reflect the morphology and inner surface roughness of the pores within which they were grown. That is, the morphology of the nanorods can spatially map out the interior nanoscopic profile and localized contours of the internal pores of the membranes.

For example, if the inner surface of a pore within which a nanorod was grown is smooth, then the resultant nanorod is straight and smooth. Alternatively, if the inner surface of a pore is rough, then the resultant nanorod has protrusions or depressions on its surface.

Figure 10:
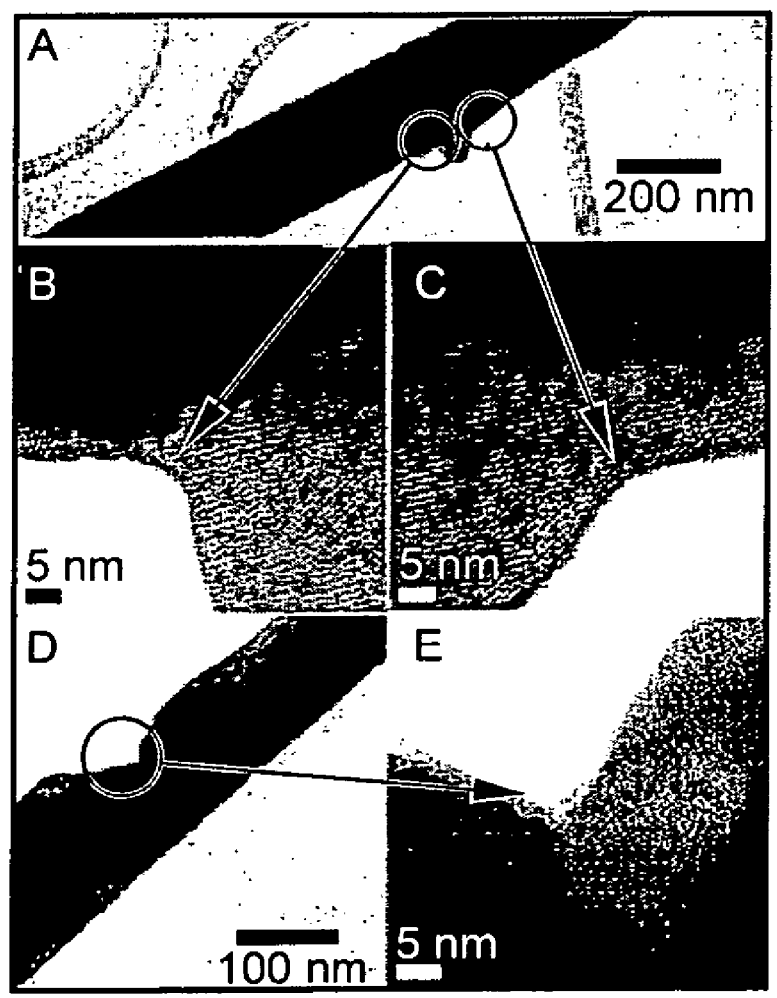
FIG. 10. (A) TEM image of a single $BaWO_4$ nanorod containing a protrusion. (B and C) HRTEM images corresponding to different sections, defined by the blue and green circles, respectively, of the single $BaWO_4$ nanorod, shown in (A). (D) TEM image of a single $BaCrO_4$ nanorod containing a notched depression. (E) HRTEM view of the portion of the single $BaCrO_4$ nanorod, highlighted by a red circle in (D).

FIGS. 10A and 10D show examples of a hump-like protrusion from an ~200 nm $BaWO_4$ nanorod as well as a pit-like depression from an ~100 nm $BaCrO_4$ nanorod, respectively, arising from imperfections within the alumina pores. It was evident that even in these regions, the nanorods remained pure and single-crystalline, clearly preserving their 2-D lattice fringes (i.e., FIGS. 10B, C, and D).

Examples of membranes suitable for the present invention include porous alumina or silica membranes; "track-etch" polymeric membranes; copolymer templates; and TEFLON® membranes.

Alumina membranes have dimensions of the pores which are tunable in the range of 4 to several hundred nanometers. Pore densities as high as $10^{11}$ pores/cm$^2$ can be obtained, and typical membrane thickness can range from 10 to 100 μm. Preferred membranes are porous anodic alumina (AAO) membranes. The AAO membranes have a porosity of 40 to 65%.

Silicon membranes are obtained by electrochemical etching of silicon wafers. The resulting porous structures has a thin nanoporous layer (with pore diameters of as small as 3 nm) on top of macroporous layer.

Track-etch membranes contain randomly distributed nanochannels (i.e., pores) of uniform diameter (as small as 10 nm). Pore densities approach $10^9$ pores/cm$^2$. These commercially available membranes are usually prepared from polycarbonate or polyester.

Preferably, porous anodic alumina membranes are used in the methods of the present invention because of their high pore density, parallel and straight channels, distribution of cylindrical pores of highly uniform diameter arranged in a hexagonal array, and size tunability of ca. 5 to 300 nm. Moreover, these membranes are thermally and mechanically stable, with pore densities as high as $10^{11}$ pores/cm$^2$ readily achievable. (Schmid, G., *J. Mater. Chem.*, 2002, 12, 1231; Mallouk, T. E., *Science*, 2001, 291, 443; and Hulteen et al., *J. Mater. Chem.*, 1997, 7, 1075 are incorporated herein by reference.)

Uses of the Nanostructures

The nanostructures of the present invention have diverse applications including being building blocks of functional nanoscale devices.

For example, nanostructures with the formula of $ABO_4$ have a wide range of uses. For instance, barium tungstate, $BaWO_4$ (also called barite), nanostructures are suitable for use in the electro-optical industry due to their emission of blue luminescence, ascribed to the influence of the Jahn-Teller effect on the degenerated excited state of the $(WO_4)^{2-}$ tetrahedral structure. In addition, their thermoluminescence and stimulated Raman scattering (SRS) properties allow $BaWO_4$ nanostructures to be used in solid-state lasers that can emit radiation within a specific spectral region. As such, these nanostructures are suitable for medical laser treatment applications, up-conversion fiber lasers, and analogous spectroscopic functions.

Additionally, barium chromate, $BaCrO_4$ (also called hashemite), nanostructures are suitable for use as oxidizing agents and as catalysts for enhancing vapor-phase oxidation reactions. Moreover, due to their excellent photophysical and photocatalytic properties, such nanostructures are highly efficient photocatalysts, with a particularly marked response to visible light irradiation (Yin et al., *Chem. Phys. Lett.*, 2003, 378, 24).

Fluorides have wide applications in optics, as windows, biological labels, and lenses, as well as components of insulators, gate dielectrics, wide-gap insulating overlayers, and buffer layers in semiconductor-on-insulator structures. In addition, fluorides, doped with rare-earth ions such as $Eu^{+3}$, $Nd^{+3}$, and $Ho^{+3}$, display unique luminescence properties with correspondingly useful applications in diagnostics, lasing, solid state light emitters, light amplification, optical telecommunication, and upconversion. Nanoscale fluorides can be used in technological applications including as high-density optical storage devices, nanosensors, and color displays.

Nanostructures with formula $DEF_3$ have attractive physical properties, such as ferromagnetic, piezoelectric characteristics, and photoluminescence properties. They have wide applications as radiation detection and laser medium, etc. For example, $KMnF_3$ nanostructures have antiferromagnetic properties. At room temperature, they are paramagnet with a cubic perovskite structure, while at 88.3 K they undergo a transition to an antiferromagnetic ordered state.

Nanostructures with formula $GF_2$ have photoluminescence properties, a large optical transmission domain, high resistivity, electron acceptor behavior, or anionic conductivity. These properties are due to the specificity of fluorine as the most electronegative element. These nanostructures are suitable as host materials for optical applications, such as photochemical hole burning or X-ray storage phosphors. These nanostructures are also suitable for medical imaging and high-density optical data storage. For example, magnesium fluoride has been identified as a positive uniaxial crystal, which possesses the highest birefringence and a wide range of transparency in the spectrum region. These properties allow for the use of $MgF_2$ for infrared transparent windows. (Cao et al., Solid State Chem. 2004, 177, 2205).

EXAMPLES

Example 1

Materials Preparation. Alumina template membranes (Fisher Scientific) with pore sizes of 100 nm and 200 nm were prepared by a two-step aluminum anodic oxidation process. (See Schmid, G., J. Mater. Chem., 2002, 12, 1231 and Hulteen et al., J. Mater. Chem., 1997, 7, 1075, both incorporated herein by reference.) The membrane was initially hydrated by immersion and sonication in a small volume of distilled, deionized water for a few minutes, so as to avoid air bubble formation within its structure or on its surface. Subsequently, the membrane was mounted between the two halves of a U-tube cell. The half-cells were then filled with equimolar solutions of $Ba(NO_3)_2$ and either $Na_2WO_4$ or $Na_2CrO_4$ solutions to generate barium tungstate and chromate, respectively. After immersion times of up to 12 hours at room temperature, the alumina template, into which the precursors had presumably diffused resulting in product formation, was detached and thoroughly washed with deionized water. The alumina membrane was subsequently dissolved by immersion in 1 M NaOH for about 30 min. FIG. 1 schematically illustrates the experimental setup utilized.

The nanorods, which were characterized by means of X-ray diffraction (XRD), scanning electron microscopy (SEM), transmission electron microscopy (TEM), high resolution TEM (HRTEM), selected area electron diffraction (SAED), energy dispersive X-ray spectroscopy (EDS), Raman and FT-IR analyses, were collected by centrifugation. These were then washed with deionized water until the pH of the product suspensions attained approximately a value of 7. To prepare SEM samples of the corresponding $BaWO_4$ and $BaCrO_4$ nanorod arrays, a previously developed procedure was utilized. (See Lakshmi et al., Chem. Mater., 1997, 9, 857, incorporated herein by reference.) Briefly, alumina membranes containing $BaWO_4$ and $BaCrO_4$ nanorods were glued (using Epoxy resin) to a piece of paper towel. Resulting composites were immersed into a 1 M NaOH aqueous solution for ~0.5 hour to dissolve the alumina. After washing steps with distilled, deionized water followed by air-drying, samples were subsequently mounted onto SEM stubs for imaging.

Materials Characterization. Products were characterized by a number of different methodologies, including XRD, SEM, TEM, HRTEM, SAED, and EDS as well as with Raman and FT-IR spectroscopies.

X-ray Diffraction. Crystallographic and purity information on the as-prepared barium tungstate and barium chromate nanostructure samples were obtained using powder XRD. To generate these samples, the as-prepared $BaWO_4$ and $BaCrO_4$ products, upon centrifugation, were subsequently sonicated for about 1 min, and later air-dried upon deposition onto glass slides. The diffraction patterns were collected using a Scintag diffractometer, operating in the Bragg configuration using Cu $K_\alpha$ radiation ($\lambda$=1.54 Å) from 10 to 80° at a scanning rate of 2° per minute.

Electron Microscopy. The size and morphology of the resulting $BaWO_4$ and $BaCrO_4$ products were initially characterized using a field emission SEM (FE-SEM Leo 1550) at accelerating voltages of 15 kV. Specifically, solid $BaWO_4$ and $BaCrO_4$ samples of isolated nanorods and their associated arrays immobilized onto Epoxy resin were mounted onto conductive carbon tapes, which were attached to the surfaces of SEM brass stubs. These samples were then conductively coated with gold by sputtering for 15 seconds to minimize charging effects under SEM imaging.

Low magnification TEM images were taken at an accelerating voltage of 120 kV on a Philip CM12 instrument, equipped with EDS capabilities. HRTEM images and SAED patterns as well as EDS data were obtained on a JEOL 2010F HRTEM (equipped with an Oxford INCA EDS system and subsequent potential of performing SAED) at an accelerating voltage of 200 kV to further characterize individual $BaWO_4$ and $BaCrO_4$ nanorods. Specimens for all of these TEM studies were prepared by depositing a drop of these aqueous suspension samples onto a 300 mesh Cu grid, coated with a lacey carbon film. Prior to deposition, solutions containing samples of $BaWO_4$ and $BaCrO_4$ nanorods, were sonicated for 2 min to ensure adequate dispersion of the nanorods.

Optical spectroscopy. Samples for Raman spectroscopy were analyzed on a Kaiser micro-Raman instrument, with a 200-micron confocal aperture, at a laser excitation of 752.5 nm using a power level of 5 mW. Infrared spectra were obtained, using a ThermoNicolet Nexus 670 using a ZnSe single reflectance ATR accessory.

Results

X-ray Diffraction

Figure 2:
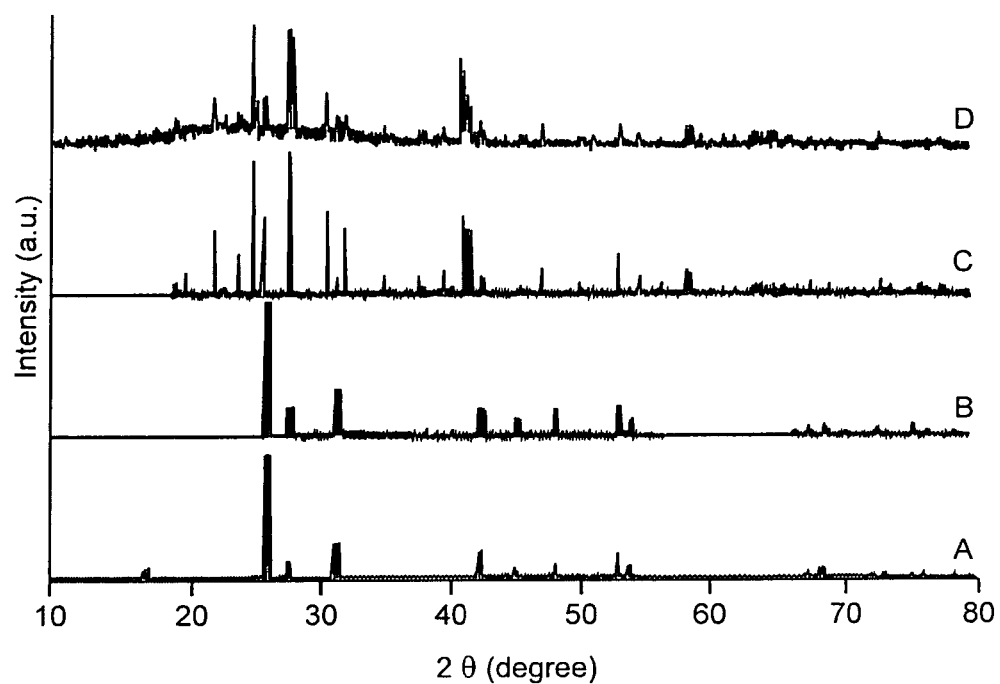
FIG. 2. X-ray diffraction (XRD) patterns arising from (A) JCPDS # 72-0746 database standard ($BaWO_4$); (B) as-prepared $BaWO_4$ nanorod sample; (C) JCPDS # 78-1401 database standard ($BaCrO_4$); and (D) as-prepared $BaCrO_4$ nanorod sample.

As-prepared $BaWO_4$ and $BaCrO_4$ nanorod samples were examined by powder XRD measurements on a Scintag diffractometer with Cu K$\alpha$ radiation (FIG. 2). Diffraction peaks in FIG. 2B can be indexed to a scheelite-structured, tetragonal phase $BaWO_4$ with calculated cell constants of a=5.610 Å and c=12.711 Å, which are numerically close to the reported values of the bulk materials (FIG. 2A, JCPDS File No. 72-0746). By analogy, diffraction peaks in FIG. 2D can be indexed to a hashemite-structured, orthorhombic phase $BaCrO_4$ with calculated cell constants of a=9.105 Å, b=5.541 Å, and c=7.343 Å, which are consistent with the literature data (FIG. 2C, JCPDS File No. 78-1401).

Electron Microscopy

Figure 3:
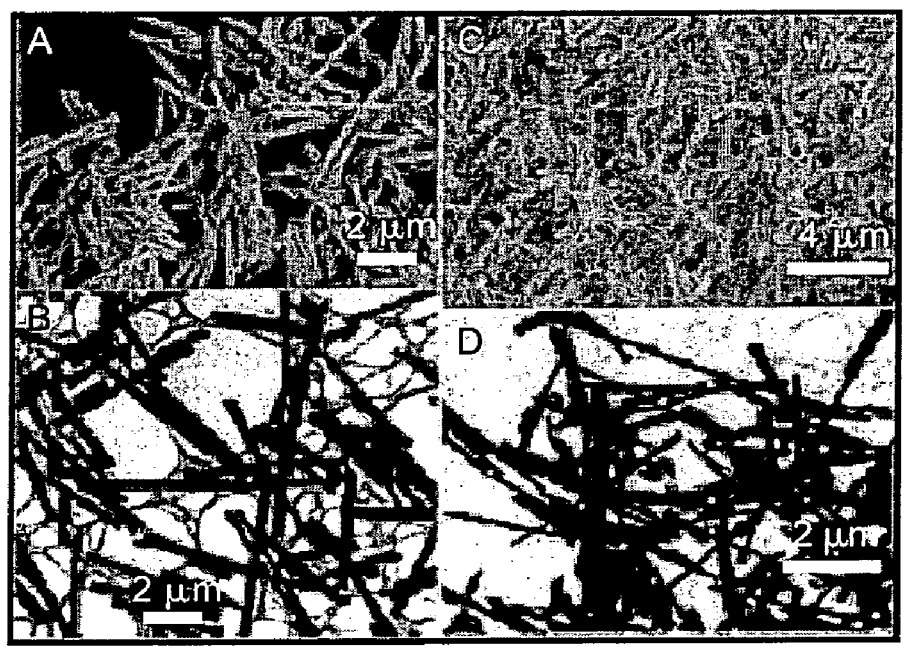
FIG. 3. (A) Typical scanning electron microscopy (SEM) micrograph of $BaWO_4$ nanorods. (B) Representative transmission electron microscopy (TEM) image of $BaWO_4$ nanorods. (C) Typical SEM micrograph of $BaCrO_4$ nanorods. (D) Representative TEM image of $BaCrO_4$ nanorods.

The morphology of the as-synthesized $BaWO_4$ and $BaCrO_4$ nanorod samples was obtained using FE-SEM and low magnification TEM. Typical SEM and TEM images of $BaWO_4$ nanorods are depicted in FIGS. 3A and 3B, respectively. On the basis of these data, it can be observed that straight, smooth, and crystalline wire-like $BaWO_4$ nanorods, with a uniform diameter throughout their entire length, were produced. Diameters of $BaWO_4$ nanorods obtained were ~200±25 nm (25 different nanorods), based on the 200 nm pore sizes of the alumina membranes used in the synthesis. The shapes of these nanorods clearly replicated the pore structure of the corresponding alumina templates. The lengths of the $BaWO_4$ nanorods were as much as several microns.

FIGS. 3C and 3D show representative SEM and TEM images of $BaCrO_4$ nanorods, respectively. It can be observed that smooth and crystalline wire-like $BaCrO_4$ nanorods were produced. Diameters of the $BaCrO_4$ nanorods obtained were in the range of 100±15 nm (25 different nanorods), based upon the 100 nm pore size of the alumina membranes used as the templates. $BaCrO_4$ nanorods synthesized reached an aspect ratio of up to 15.

To provide further insight into the structure of the as-prepared BaWO$_4$ and BaCrO$_4$ nanostructures, individual nanorods were analyzed by HRTEM as well as using SAED and EDS. An image of a randomly chosen single BaWO$_4$ nanorod is shown in FIG. 4A. To confirm the chemical composition of the as-prepared nanorods, EDS spectra (FIG. 4B) were recorded at a number of different positions along a single nanorod. The chemical signatures obtained are identical within experimental accuracy, and essentially only Ba, W, and O elements are observed from the nanorod structure. The Cu signal arises from the TEM grid.

FIG. 4C presents the SAED pattern taken from a portion of a single BaWO$_4$ nanorod shown in FIG. 4A. The electron diffraction patterns obtained from different positions along individual nanorods are essentially identical within experimental accuracy (FIG. S1). Whereas template methods typically yield polycrystalline nanostructures (Xia et al., *Adv. Mater.*, 2003, 15, 353), the presence of the sharp diffraction spots rather than an amorphous ring demonstrates the predicted formation of single-crystalline BaWO$_4$. The associated electron diffraction pattern is consistent with pure BaWO$_4$ crystals of a tetragonal scheelite structure, indexed as shown in FIG. 4C. In FIG. 4D, a HRTEM image of a portion of an individual BaWO$_4$ nanorod, shown in FIG. 4A, is displayed. While a thin amorphous layer likely coats the outer BaWO$_4$ nanorod surface, the HRTEM image further confirms that the observed BaWO$_4$ nanorods are single crystalline with no defects or dislocations. The 2-D lattice fringes reveal that the single-crystalline BaWO$_4$ nanorods possess interplanar spacings of about 5.09 Å and 3.33 Å, corresponding to the (101) and (112) planes, respectively.

FIG. 5A presents an individual BaCrO$_4$ nanorod. EDS elemental analysis data (FIG. 5B) confirm the presence of Ba, Cr, and O elemental signatures associated with the product in the expected stoichiometric proportions. The SAED pattern taken from a single BaCrO$_4$ nanorod (FIG. 5C and FIG. 5D) yields sharp diffraction spots rather than rings, which are suggestive of the presence of single-crystalline BaCrO$_4$. The related electron diffraction pattern is consistent with pure BaCrO$_4$ crystals of an orthorhombic hashemite structure, indexed as shown in FIG. 5C. FIG. 5D presents a HRTEM image of a portion of an individual BaCrO$_4$ nanorod, initially described in FIG. 5A. This image reveals that the BaCrO$_4$ nanorod is single-crystalline with lattice fringe spacings of ~4.58 Å and 3.36 Å, respectively. These two planes can be indexed as the {200} and {102} planes, respectively, of an orthorhombic-phase BaCrO$_4$ crystal (JCPDS card no. 78-1401).

Figure 4:
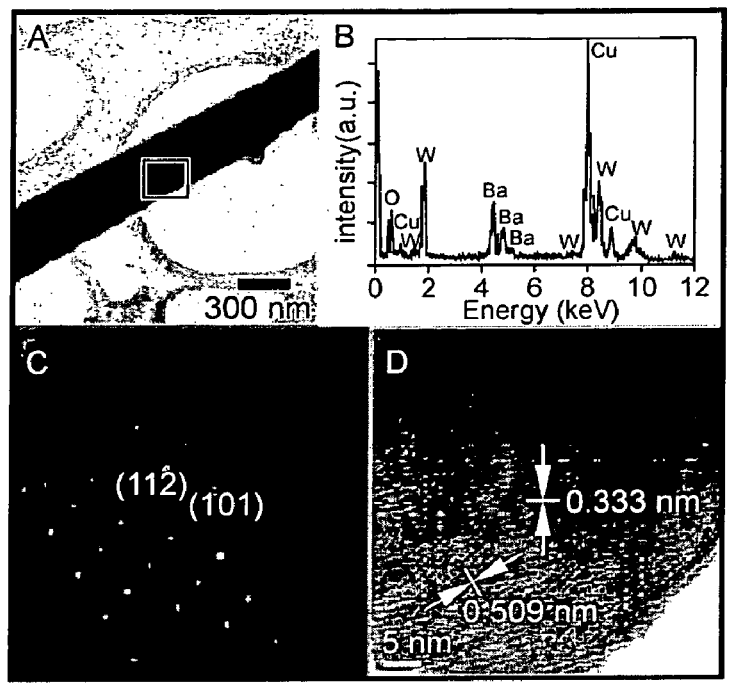
FIG. 4. (A) TEM image of a single $BaWO_4$ nanorod. (B) Energy dispersive X-ray spectrum (EDS) of as-prepared $BaWO_4$ nanorods. The Cu peaks originate from the TEM grid. (C) Selected area electron diffraction (SAED) pattern and (D) High-resolution TEM (HRTEM) image of a representative portion of a $BaWO_4$ nanorod, as delineated by the red square, in (A).
Figure 5:
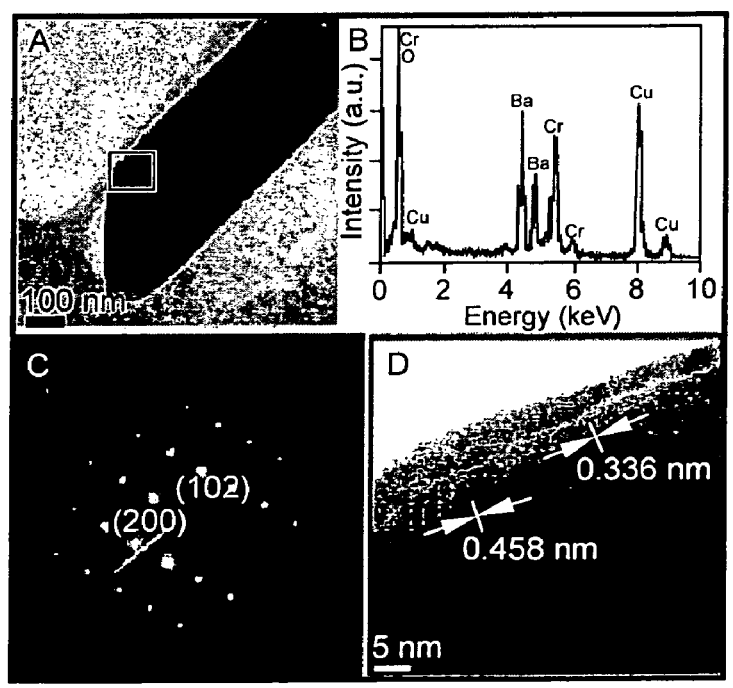
FIG. 5. (A) TEM image of a single $BaCrO_4$ nanorod. (B) EDS of as-prepared $BaCrO_4$ nanorods. The Cu peaks originate from the TEM grid. (C) SAED pattern and (D) HRTEM image of a representative portion of a $BaCrO_4$ nanorod, as defined by the red square, in (A).

Additional selected area electron diffraction patterns, associated with FIGS. 4 and 5; and a SEM image of the cross-section of a 200 nm pore-sized alumina template, containing BaWO$_4$ nanorods, are available at http://pubs.acs.org, and incorporated herein by reference.

Figure 6:
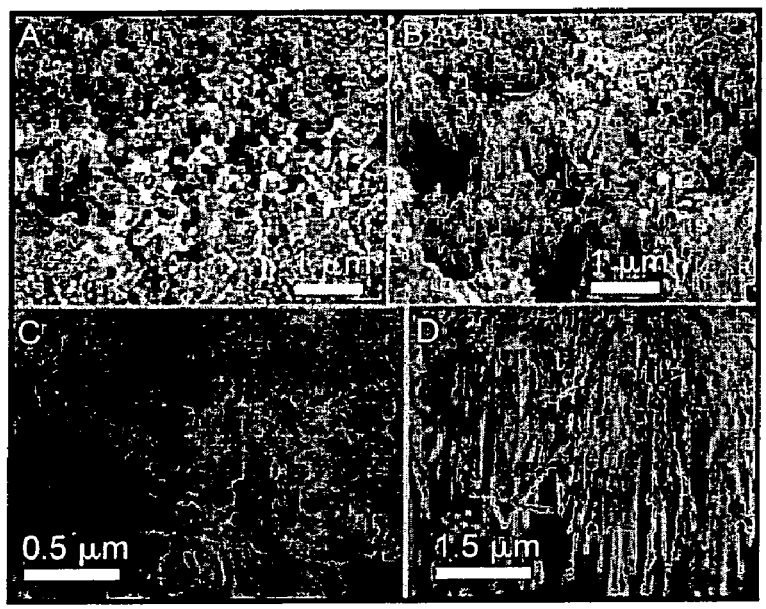
FIG. 6. SEM images of as-prepared $BaWO_4$ nanorod arrays: (A) top-view; (B) tilt-view. Analogous images of as-prepared $BaCrO_4$ nanorod arrays: (C) top-view; (D) tilt-view. The less-than-optimal packing of $BaCrO_4$ nanomaterials arises from the inhomogeneous distribution of the as-formed individual nanorods.

FIG. 6 illustrates the top and tilt views of the SEM images of BaWO$_4$ and BaCrO$_4$ nanorod arrays, respectively, grown within the alumina templates. The SEMs show that the nanorods are individually separated from each other. Nonetheless, they form a dense, continuous network, where the nanorods are roughly parallel to each other and vertically oriented on the substrates to form a packed array, stretching over micron-sized areas. This is especially true of BaWO$_4$. The diameters of these nanorods are about 101±8 nm (50 different nanorods), corresponding to the diameter of channels in the alumina template. What is important to note is that these arrays of ABO$_4$-type nanorods were produced very readily at room temperature without the need for sophisticated experimental setups (characteristic of arrays formed by vapor transport via VLS-type methodologies (Huang et al., *Science*, 2001, 292, 1897)), or for high-temperature annealing (associated with sol-gel template approaches (Lakshmi et al., *Chem. Mater.*, 1997, 9, 857; Limmer et al., *Adv. Funct. Mater.*, 2002, 12, 59; and Hulteen et al., *J. Mater. Chem.*, 1997, 7, 1075)). Moreover, the sizes of these BaWO$_4$ and BaCrO$_4$ nanorods could be readily varied by choosing membranes, possessing different pore sizes.

Figure 7:
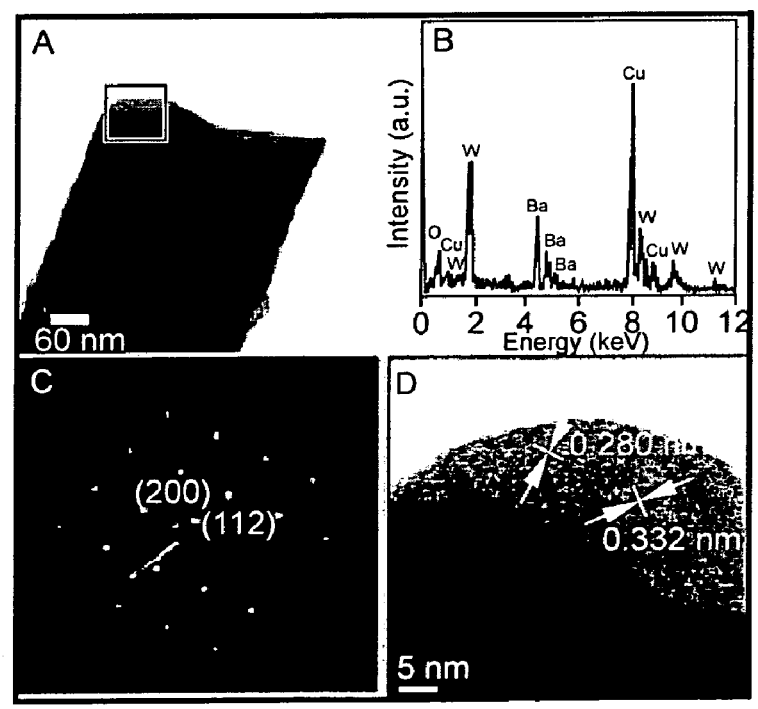
FIG. 7. $BaWO_4$ nanorods upon annealing in air for 5 h at 650° C. (A) TEM image of a single $BaWO_4$ nanorod. (B) EDS of the $BaWO_4$ nanorod, shown in (A). Cu peaks originate from the TEM grid. (C) SAED pattern and (D) HRTEM image from a portion of a $BaWO_4$ nanorod, shown in (A).

To investigate the thermal stability of the as-prepared nanorods, samples of BaWO$_4$ and BaCrO$_4$ nanorods were further heated in air for 5 h at 650° C. FIG. 7 reveals that their morphologies and crystallographic orientations remain essentially unaltered after this annealing step. It is noteworthy that the thickness of the surface amorphous layer on the nanorods is somewhat thinner than that of the as-prepared samples. Hence, samples of BaWO$_4$ and BaCrO$_4$ nanorods are suitable for applications at elevated temperatures, such as high-temperature catalysis.

Optical Spectroscopy

Figure 8:
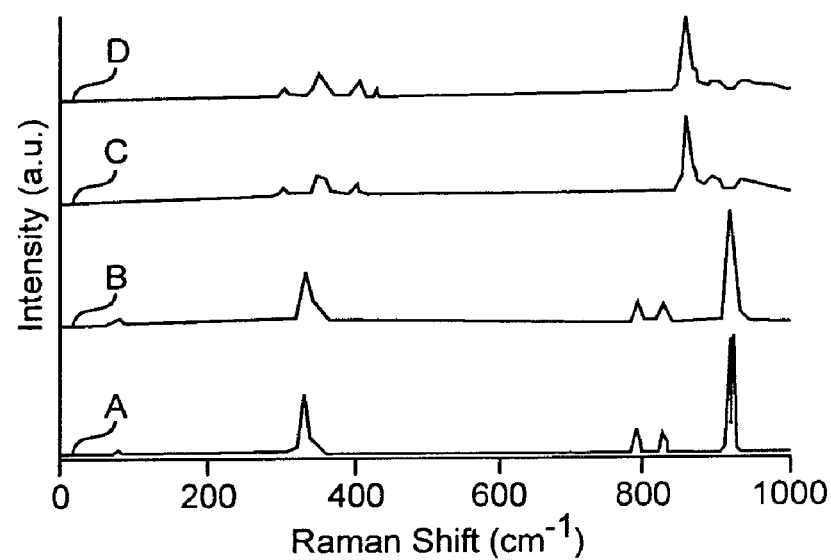
FIG. 8. Raman spectra of (A) bulk commercial, crystalline $BaWO_4$ powder; (B) as-prepared single-crystalline $BaWO_4$ nanorods; (C) bulk commercial, crystalline $BaCrO_4$ powder; and (D) as-prepared single-crystalline $BaCrO_4$ nanorods.

Optical properties of the synthesized nanorods were also investigated. FIG. 8 shows Raman spectra of the as-prepared products and the corresponding bulk commercially available samples (Aldrich) of BaWO$_4$ and BaCrO$_4$, corroborating the chemical identity of the nanostructures. Spectra of the as-prepared nanorods (FIGS. 8B and 8D) show typical Raman bands, which can be attributed to crystalline BaWO$_4$ and BaCrO$_4$, respectively (Miller et al., *J. Phys. Chem. Solids*, 1973, 34, 533 and Scheuermann et al., *J. Raman Spectrosc.*, 1973, 1, 605). According to the reported literature, the vibrational modes of isolated BO$_4$ tetrahedra can be separated into internal, external translational, and rotational modes. As shown in FIG. 8B, bands at 927, 833, 797, 347, and 334 cm$^{-1}$ can be assigned to the $\upsilon_1(A_g)$, $\upsilon_3(B_g)$, $\upsilon_3(E_g)$, $\upsilon_4(B_g)$, and $\upsilon_2(B_g)$ modes, respectively, of the as-prepared BaWO$_4$ nanorods. Peaks located at 197 and 159 cm$^{-1}$, as well as at 106 and 78 cm$^{-1}$, can also be assigned to their rotational ($A_g$, $E_g$) and translational modes ($E_g$, $B^g$), respectively. In FIG. 8D, peaks at positions corresponding to 909/906, 864, 432/406, and 361/352 cm$^{-1}$ could be attributed to the $\upsilon_3$, $A_g$, $\upsilon_4$, and $\upsilon_2$ modes, respectively, of as-prepared BaCrO$_4$ nanorods. Moreover, bands at 306 and 72 cm$^{-1}$ can be assigned to the lattice vibrations of BaCrO$_4$ nanorods.

Figure 9:
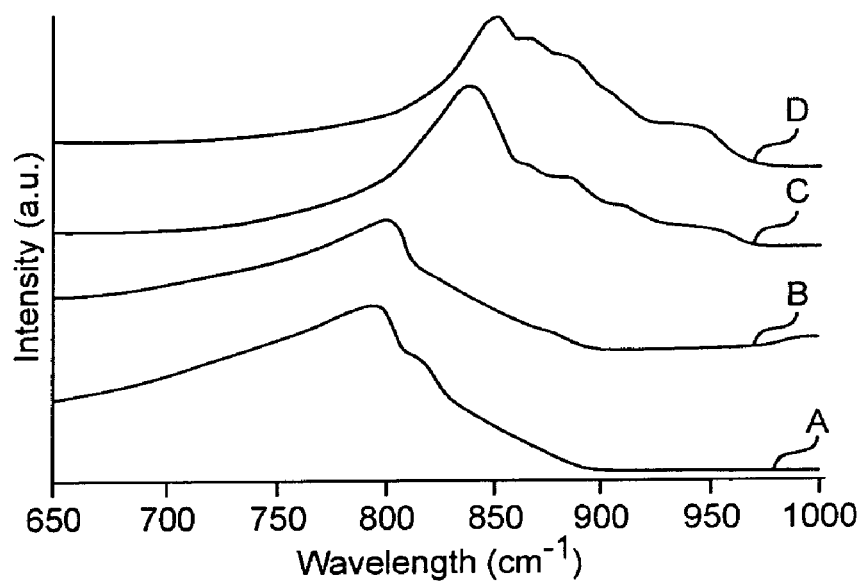
FIG. 9. FT-IR spectra of (A) bulk commercial, crystalline $BaWO_4$ powder; (B) as-prepared single-crystalline $BaWO_4$ nanorods; (C) bulk commercial, crystalline $BaCrO_4$ powder; and (D) as-prepared single-crystalline $BaCrO_4$ nanorods.

In the FT-IR spectra (FIG. 9), the strong band at 802 cm$^{-1}$ and its shoulder (FIG. 9B) appear to result from the $E_u$ and $A_u$ components, respectively, of the $\upsilon_3$ band of BaWO$_4$ nanorod sample. In addition, one $\upsilon_1$ band at 852 cm$^{-1}$ and three additional $\upsilon_3$ bands at 868, 885, and 943 cm$^{-1}$, respectively, have been observed associated with the BaCrO$_4$ nanorod sample (FIG. 9D).

Considering the imperfect correlation between the IR spectra of the bulk solid (FIG. 9A, C) vs. nanorod samples (FIG. 9B, D), this type of phenomenon has been observed previously. First of all, in tungstate and molybdate systems (Miller et al., *J. Phys. Chem. Solids*, 1973, 34, 533), for some of the IR-active vibrations, the frequency difference between the longitudinal optic and the transversal optic modes is rather large, and the location of the "absorption" maximum of these samples often depends on the granular nature of the sample. Indeed, for the high-frequency band at around 820 cm$^{-1}$, the situation is further complicated by the overlapping in the same spectral region of 2 IR-active components of $\upsilon_3$. Secondly, there is a larger degree of surface strain, associated with the smaller nanocrystal; this effect may be related to changes in coupling to lattice vibrational modes. Thirdly, the blue shift in the infrared absorption peaks of the chromate and tungstate nanocrystals as compared with their bulk counterparts may be attributed to quantum confinement effects. Similar behavioral trends have been observed for a number of other systems including $CaCO_3$, InSb, and $VO_2$ (Zhu et al., *Solid State Comm.*, 1998, 107, 79; Tarte et al., *Spectrochim. Acta*, 1972, 28A, 2029; Yue et al., *J. Zhejiang Uni., Sci.*, 2000, 1, 178; and Zheng et al., *J. Solid State Chem.*, 2001, 156, 274).

The results of Raman and IR data further corroborate the other data collected, confirming the identity of the as-prepared nanomaterials as indeed $BaWO_4$ and $BaCrO_4$, respectively. The generation of these materials provides the basis for a more thorough future investigation of their novel optical, optoelectronic, and catalytic properties for possible incorporation into nanoscale devices. The lasing and photocatalytic properties of these materials is particularly important.

Mao et al. "General, Room-Temperature Method for the Synthesis of Isolated as Well as Arrays of Single-Crystalline $ABO_4$-Type Nanorods," *J. Am. Chem. Soc.* 2004 126:15245-52 is incorporated herein by reference in its entirety.

Example 2

Materials Preparation

Figure 17:
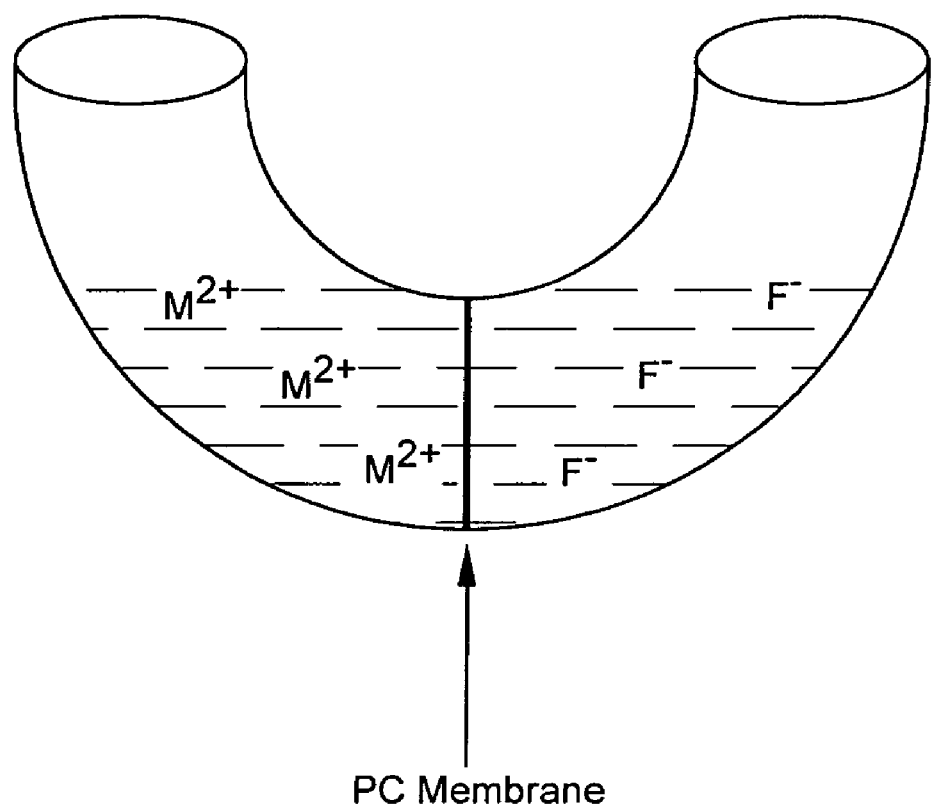
FIG. 17. Schematic of the experimental setup used to synthesize alkaline earth metal fluoride nanowires. The polycarbonate membranes used in this work had pore diameters of 50, 100 and 200 nm, respectively.

Commercially available polycarbonate membranes (Whatman Co., UK) used in this study contain pore sizes of 50, 100, and 200 nm diameter, respectively, with a thickness of ~6 μm. These polycarbonate filters contain track-etched channels. Pores were randomly distributed across the filter membranes, and pore densities were quoted as approaching $3\times10^8$ pores $c^{-2}$. In order to avoid air bubble formation on their surface, the membranes were pre-hydrated by immersion and sonication in a small volume of distilled, deionized water for a few minutes. Subsequently, the membrane was placed between the two arms of a U-shaped tube (FIG. 17).

In the typical synthesis, each half cell was filled with a solution of 0.25 M $NH_4F$ and either 0.125 mM $CaCl_2$, $SrCl_2$, or $Ba(NO_3)_2$ solutions to generate calcium fluoride, strontium fluoride and barium fluoride nanowires, respectively. After immersion times of up to 12 hours at room temperature, the polycarbonate membrane was detached and thoroughly washed with deionized water and subsequently dissolved in the presence of methylene chloride. Upon washing, alkaline earth metal fluoride nanowires were collected by centrifugation.

To limit unwanted particle formation and deposition onto the exterior of the polycarbonate templates, the nanowire products were selectively fabricated within the inner pores only. To this end, microcontact printed octadecyltetrachlorosilane (OTS) self-assembled monolayers as passivation layers on the external surfaces of polycarbonate membranes were used. (A. Kumar et al. Appl. Phys. Lett. 1993, 63, 2002.) Hence, prior to mounting of the polymeric membrane templates between the two halves of the U-shaped tube, both sides of the polycarbonate membranes were gently pressed with a homemade polydimethylsiloxane (PDMS) stamp, which had been initially inked with a 10 mM hexane solution of OTS and subsequently dried with nitrogen.

Materials Characterization

To prepare powder XRD samples, the resulting alkaline earth metal fluoride nanowires were rendered into slurries in ethanol, sonicated for about 1 min, and then air-dried with deposition onto glass slides. Diffraction patterns were collected using a Scintag diffractometer, operating in the Bragg configuration using Cu Kα radiation ($\lambda$=1.54 Å) from 10 to 80° at a scanning rate of 4° per minute.

The size and morphology of the resulting alkaline earth metal fluoride nanowires were initially characterized using a field emission SEM (FE-SEM Leo 1550), operating at accelerating voltages of 15 kV. Specifically, samples for SEM were prepared by dispersing as-prepared products in ethanol, sonicating for about 2 min, and ultimately deposited onto a conductive carbon tape, attached to the surface of a SEM brass stub. All samples were subsequently conductively coated with gold by sputtering for 15 s to minimize charging effects under SEM imaging conditions.

Both TEM and HRTEM images of fluoride nanowires were obtained on a JEOL 2010F instrument at accelerating voltages of 200 kV. It was equipped with an Oxford INCA EDS spectroscopy system with the potential of performing SAED. Specimens for all of these TEM experiments were prepared by dispersing a small quantity of as-prepared product in ethanol, sonicating for 2 min to ensure adequate dispersion of the nanowires, and ultimately evaporating one drop of the solution onto a 300 mesh Cu grid, coated with a lacey carbon film.

Alkaline metal earth nanowires, doped with Eu(III) and Tb(III), respectively, were prepared by adding either Eu or Tb salt (nitrate or chloride) at concentrations up to 8.0 atom percent into the appropriate U-tube half-cell, containing $CaCl_2$/$SrCl_2$/$Ba(NO_3)_2$ solution. Samples for photoluminescence (PL) spectra were dispersed in deionized water and sonicated for 1 min. A similar protocol was employed for the preparation of bulk samples by directly mixing all of the precursor solutions, with the exception that no U-tube apparatus was used. Fluorescence data were obtained at room temperature on a Jobin Yvon Spex Fluorolog 3 with a 10 s integration time. PL spectra for $Eu^{3+}$ and $Tb^{3+}$ were taken using excitation wavelengths of 365 and 350 nm, respectively.

Results and Discussion

Figure 11:
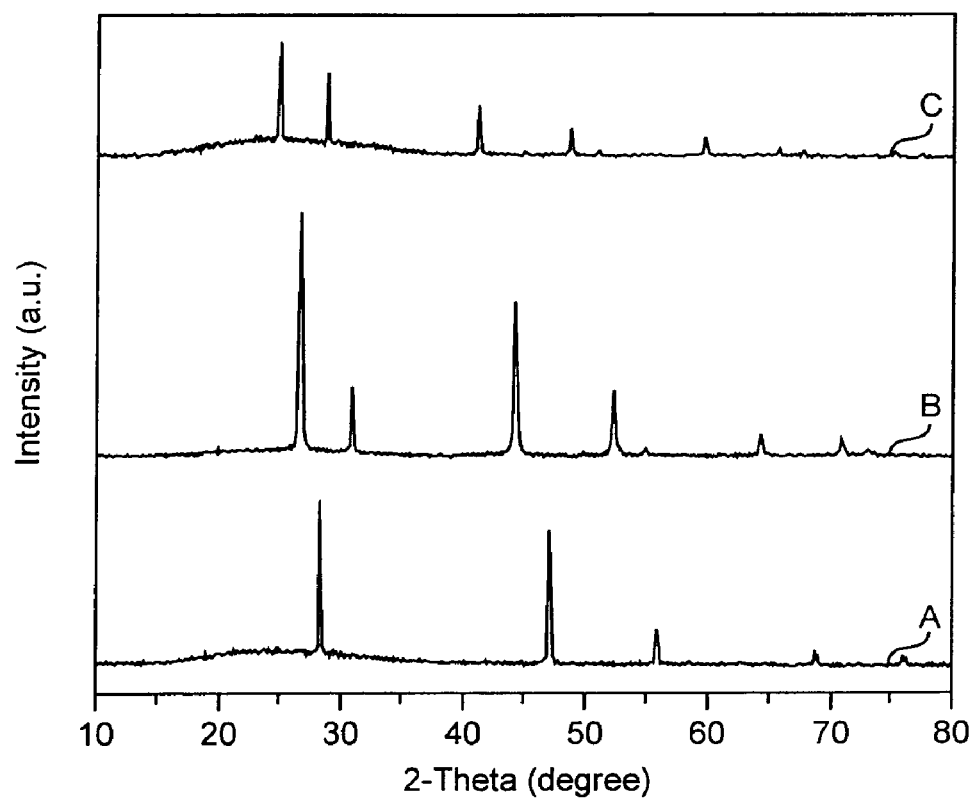
FIG. 11. X-ray powder diffraction (XRD) patterns of as-prepared samples, prepared using polycarbonate membranes with pore sizes of 200-nm diameter: (A) $CaF_2$, (B) $SrF_2$, and (C) $BaF_2$ nanowires.

The purity and crystallinity of as-prepared alkaline earth metal fluoride samples were characterized by powder X-ray diffraction (XRD). FIG. 11 shows diffraction patterns collected on as-prepared samples of $CaF_2$, $SrF_2$, and $BaF_2$ in the 2θ range of 10 to 80 degrees. Very little if any impurity peaks are present. All of the diffraction peaks in FIG. 11A can be readily indexed to a pure face-centered cubic phase [space group: Fm3m (225)] of $CaF_2$ with a calculated lattice constant, a=5.435 Å, in good agreement with the literature value of a=5.4355 Å (JCPDS 77-2096). Similarly, diffraction peaks in FIG. 11B can be ascribed to a pure face-centered cubic phase [space group: Fm3m (225)] of $SrF_2$ with accompanying lattice constant, s=5.802 Å, comparable with the corresponding literature value of a=5.800 Å (JCPDS 06-0262). Finally, diffraction peaks in FIG. 11C have been assigned to a face-centered cubic phase [space group: Fm3m (225)] of $BaF_2$ with a lattice constant, a=6.198 Å, a value consistent with the accepted value of a=6.196 Å (JCPDS 85-1341) for this material.

Figure 12:
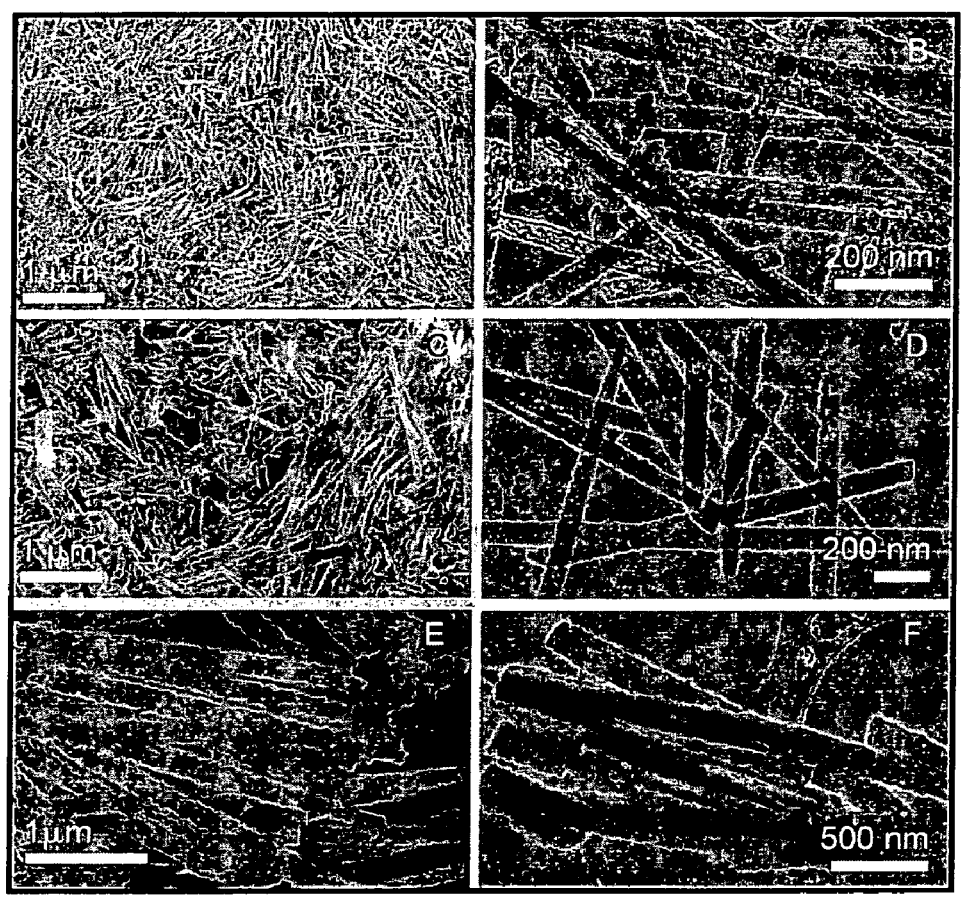
FIG. 12. (A) and (B) Typical SEM and TEM images of $CaF_2$ nanowires prepared using polycarbonate membranes with 50 nm pore sizes. (C) and (D) Representative SEM and TEM images of $SrF_2$ nanowires prepared using polycarbonate membranes with 100 nm pore diameters. (E) and (F) Typical SEM and TEM images of $BaF_2$ nanowires generated using polycarbonate membranes with pores measuring 200 nm.

The size and morphology of as-synthesized alkaline earth metal fluoride nanowires were initially examined by field-emission scanning electron microscopy (FE-SEM) and transmission electron microscopy (TEM). Typical SEM and TEM images, as shown in FIGS. 12A and 12B, respectively, reveal that as-prepared $CaF_2$ products, which were fabricated using polycarbonate membranes with pore sizes as small as 50 nnm, consist of straight nanowires with uniform, homogeneous size along their axis direction. Diameters of $CaF_2$ nanowires obtained were in the range of 50±5 nm, based on the 50 nm pore sizes of the polycarbonate membranes used. Measured lengths of $CaF_2$ nanowires varied from 1 to several microns. FIGS. 12C and 12D show representative SEM and TEM images of $SrF_2$ nanowires, derived from the 100 nm pore size of the polycarbonate membranes used as precursor templates.

These images suggest the reproducible synthesis of straight and crystalline SrF$_2$ nanowires with a diameter range of 80-110 nm and a length range of 2 to 3 microns. Representative SEM and TEM images of BaF$_2$ nanowires, grown in polycarbonate membranes with 200 nm pore sizes, are depicted in FIGS. 12E and 12F, respectively. The micrographs show the presence of dispersed individual nanowires as well as bundled, aggregated species. As-prepared nanowires possess diameters ranging from 175 to 200 nm and lengths of 2 to 3.5 µm. These nanowires maintain a uniform diameter around 200 nm throughout their entire length; surfaces of these structures are smooth over much of their lengths, with the presence of relatively few if any extraneous particulate debris.

Figure 13:
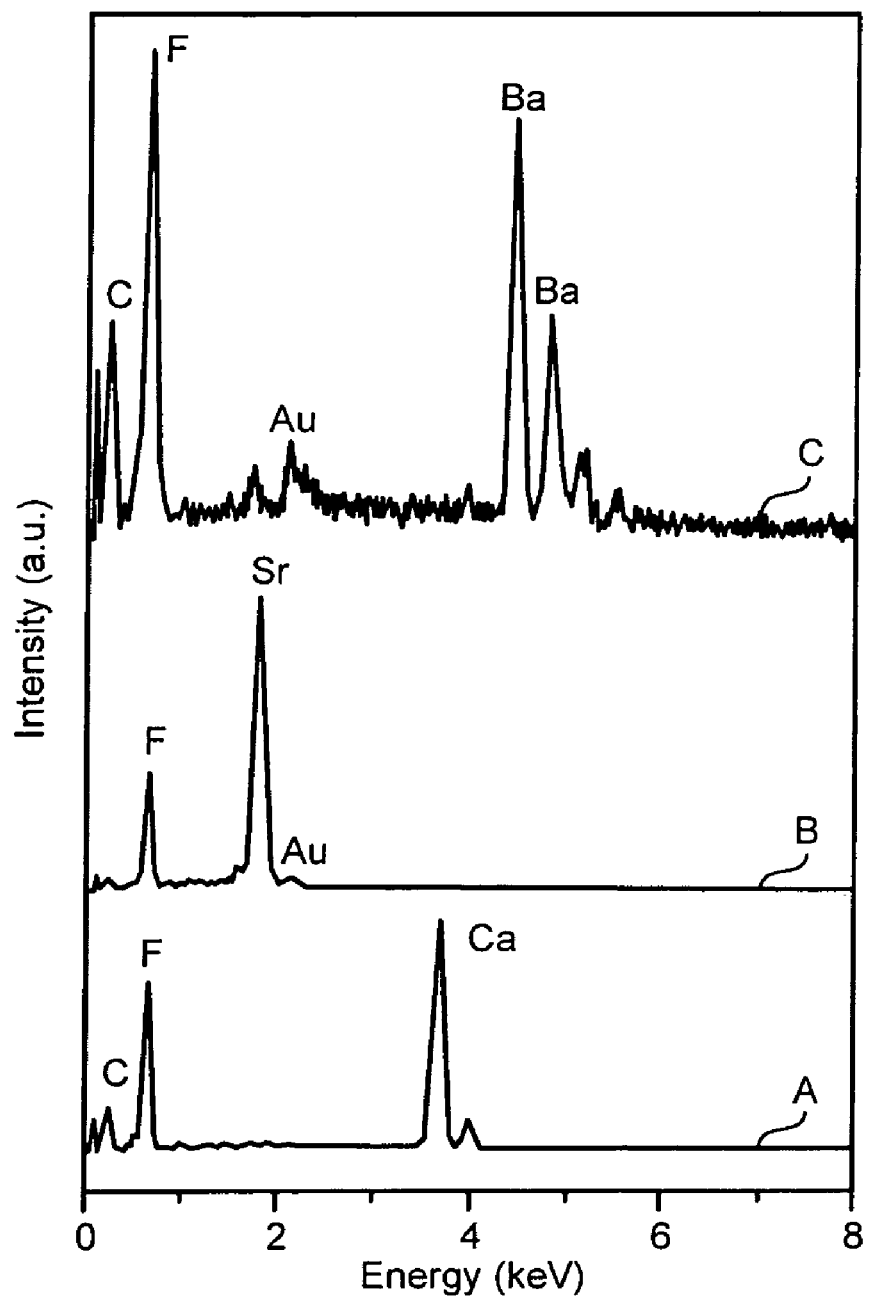
FIG. 13. EDS data of as-synthesized alkaline earth metal fluoride nanowires, corresponding to SEM images shown in FIGS. 2A, 2C, and 2E, respectively (A) $CaF_2$, (B) $SrF_2$ and (C) $BaF_2$. The C and Au peaks originate from the conductive carbon tape and gold coating, respectively.

It is noteworthy that SEM and TEM images were obtained from randomly selected areas of the sample, and as such, are representative of the overall sizes and shapes of the as-generated alkaline earth metal fluoride nanowires. Moreover, energy-dispersive X-ray spectroscopy (EDS) data, taken during SEM analysis, revealed signals associated with either Ca, Sr or Ba as well as F, e.g. elemental signatures (FIG. 13) expected of CaF$_2$, SrF$_2$, and BaF$_2$, respectively.

All of the data presented suggest that as-prepared alkaline earth metal fluoride nanowires are monodisperse with controllable morphology. In other words, the ambient synthesis of straight, crystalline wire-like structures is possible using a modified template-directed method without the need for sophisticated experimental setups. Moreover, the shapes and sizes of these fluoride nanowires accurately replicated the interior pore structure as well as the pore lengths and diameters of the polycarbonate templates from whence they were generated. Whereas nanowires with expected lengths of several microns were routinely noted, shorter fluoride nanowires were also observed from TEM images; the latter could be attributed to localized fracturing, occurring during the sonication step employed prior to preparation of TEM samples.

Figure 14:
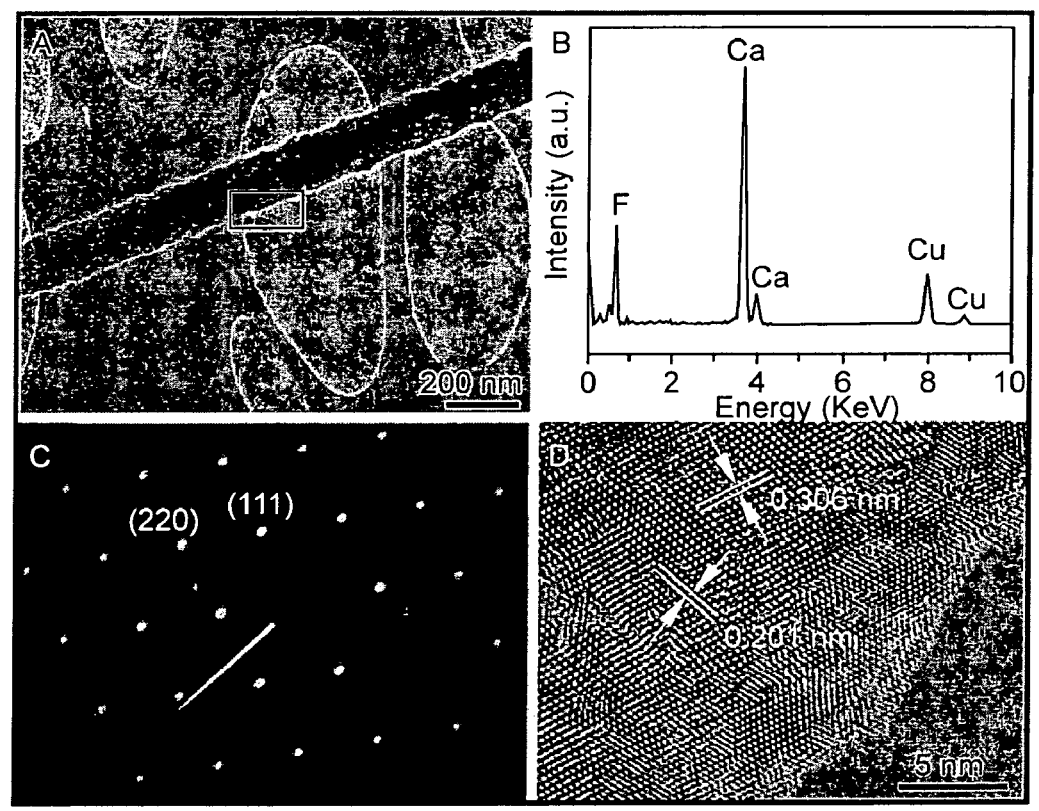
FIG. 14. (A) TEM image of a single $CaF_2$ nanowire. (B) EDS spectrum of as-prepared $CaF_2$ nanowires. The Cu peaks originate from the TEM grid. (C) and (D) SAED pattern and HRTEM image, respectively, of a representative section of a $CaF_2$ nanowire, as defined by the white square in (A).

To provide additional details about the crystallographic structure and chemical composition of as-prepared fluoride nanostructures, individual fluoride nanowires were investigated by high-resolution TEM (HRTEM), selected area electron diffraction (SAED), as well as energy dispersive X-ray spectroscopy (EDS). FIG. 14A presents a randomly chosen individual CaF$_2$ nanowire generated from polycarbonate membranes with a 50 nm pore size. Localized chemical composition analysis by EDS from a number of selected regions along the nanowires (FIG. 14B) confirms that the chemical signatures associated with the product are essentially identical within experimental accuracy and that the nanowires are composed of the elements, Ca and F. The Cu signal arises from the TEM grid.

FIG. 14C presents the SAED pattern taken from a portion of a single CaF$_2$ nanowire shown in FIG. 14A. The presence of sharp diffraction spots, as opposed to an amorphous ring, strongly supports the formation of single-crystalline CaF$_2$ nanowires. The pattern has been indexed to the reflection of a face-centered cubic CaF$_2$ structure, in good agreement with the XRD results presented above. Moreover, SAED patterns obtained from different positions along the same nanowire structure have been found to be essentially identical. In FIG. 14D, a representative HRTEM image of a part of an individual CaF$_2$ nanowire, initially outlined in FIG. 14A, is displayed. These data further confirm that the CaF$_2$ nanowire is single-crystalline without any obvious defects or dislocations. The 2-D lattice fringes reveal that the nanowire is structurally uniform with interplanar spacings of about 3.06 Å and 2.01 Å, corresponding to the (111) and (220) planes, respectively, of bulk crystalline CaF$_2$. These findings are consistent with observations from the XRD pattern.

Figure 15:
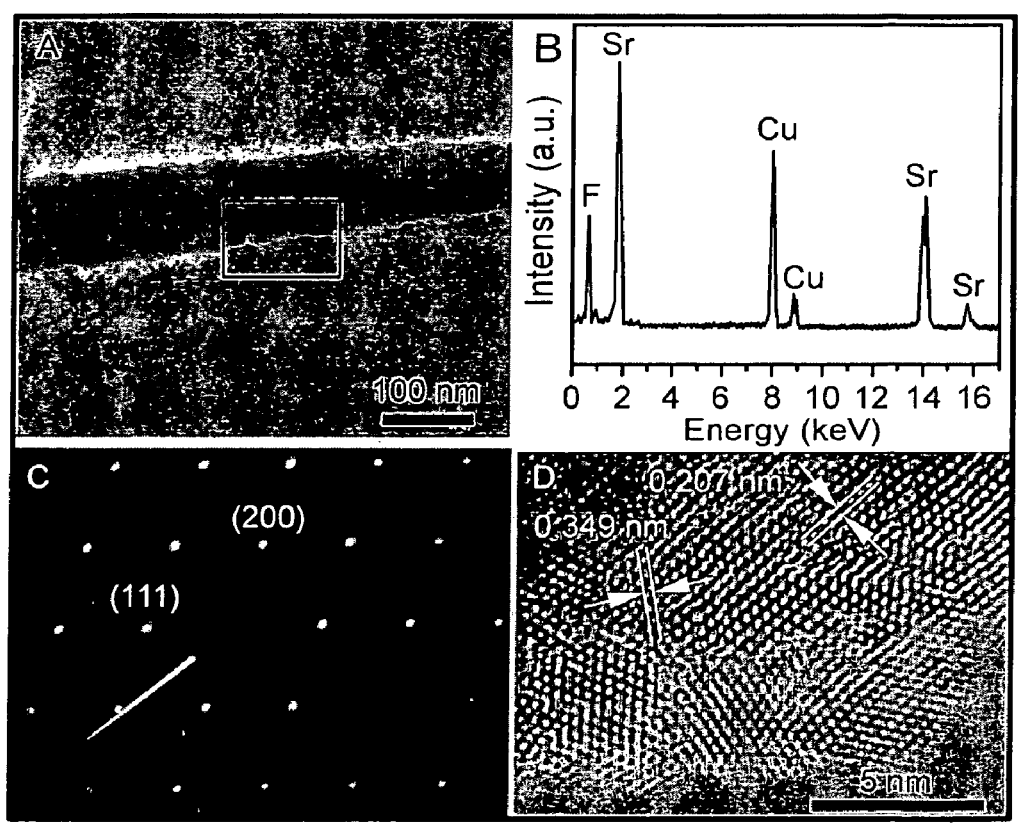
FIG. 15. (A) TEM image of a single $SrF_2$ nanowire. (B) EDS spectrum of as-prepared $SrF_2$ nanowires. The Cu peaks originate from the TEM grid. (C) and (D) SAED pattern and HRTEM image of a representative part of a $SrF_2$ nanowire, as defined by the white square in (A).
Figure 16:
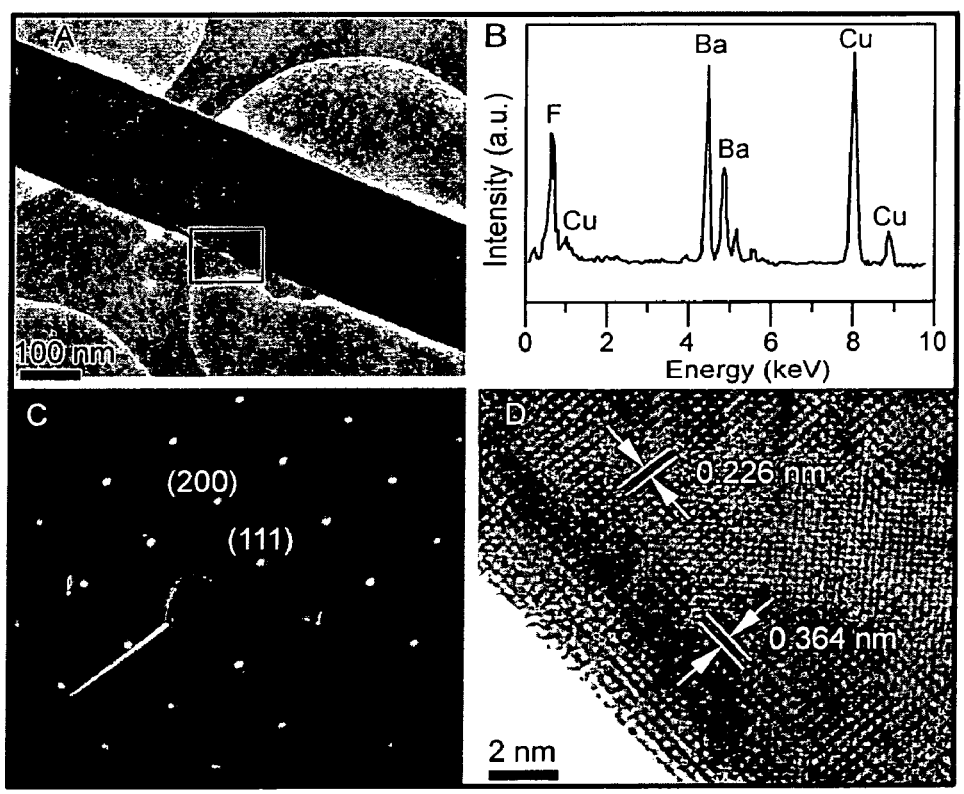
FIG. 16. (A) TEM image of a single $BaF_2$ nanowire. (B) EDS of as-prepared $BaF_2$ nanowires. The Cu peaks originate from the TEM grid. (C) and (D) SAED pattern and HRTEM image of a representative part of a $BaF_2$ nanowire, as defined by the white square in (A).

The corresponding structural and chemical analyses from HRTEM data of as-prepared SrF$_2$ and BaF$_2$ nanowires are shown in FIGS. 15 and 16, respectively. The slightly increased surface roughness, as determined from HRTEM images, of the as-prepared fluoride nanowires as compared with those of ABO$_4$ likely reflects local differences in smoothness of the inner surfaces of polycarbonate vs. alumina membrane pores.

The key to the fabrication technique (FIG. 17) is the placement of membranes within a double-diffusion setup, which enables the continuous flow of precursor ions into spatially-confined membrane pores. Single crystals of nanoscale fluoride materials derive from isolated, disparate, and multiple nucleation sites (consisting of AF2 nuclei generated via the reaction between A$^{2+}$ and F$^-$), which then grow by extension through the porous network. Continued growth then occurs at the particle surface at a rate limited by ion availability, until the crystal impinges on the polycarbonate template surface, which ultimately limits further growth. Hence, by the spatially constrained volume defined by the presence of the template itself, nanowires instead of nanoparticles are formed due to the growth environment conducive to these 1-D structures. In effect, the growth of the nanowires within the confinement of polymeric membranes is analogous to the precipitation of single crystals of calcium carbonate and calcium phosphate within the confinement offered by gels, micelles, chitin scaffolds, and collagen matrices.

Figure 18A:
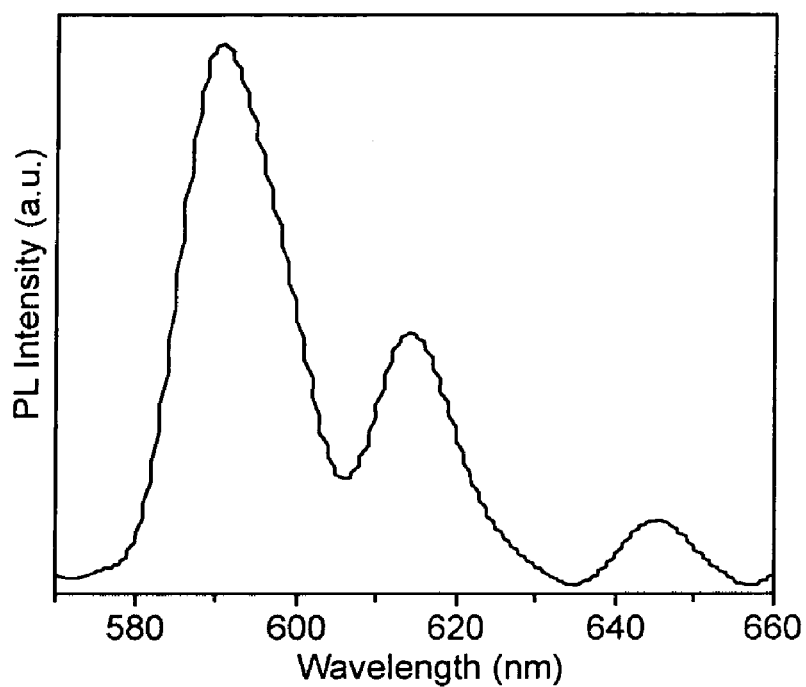
FIG. 18. Photoluminescence spectra of as-prepared $CaF_2$ nanowires doped with: (A) $Eu^{3+}$ and (B) $Tb^{3+}$.
Figure 18B:
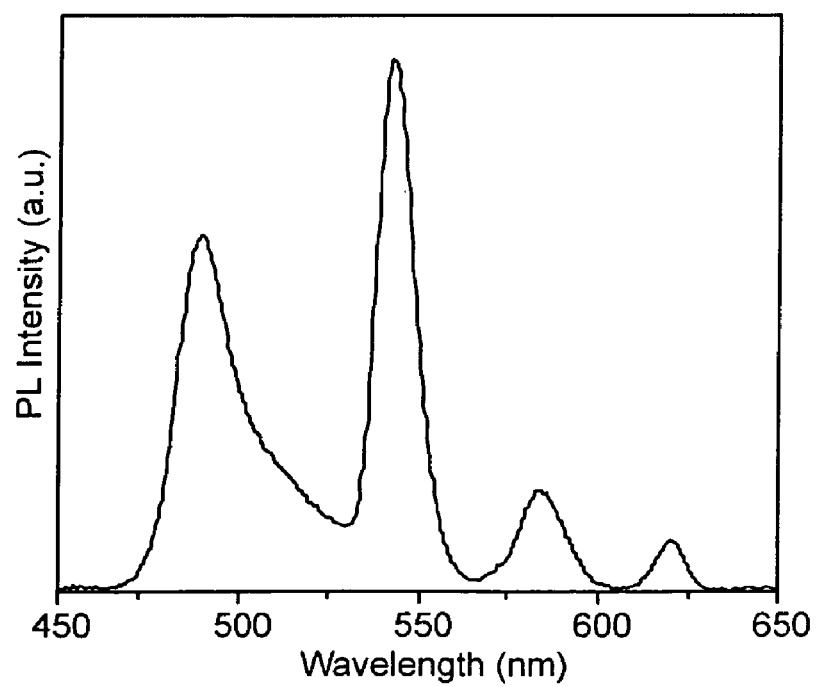
Figure 19A:
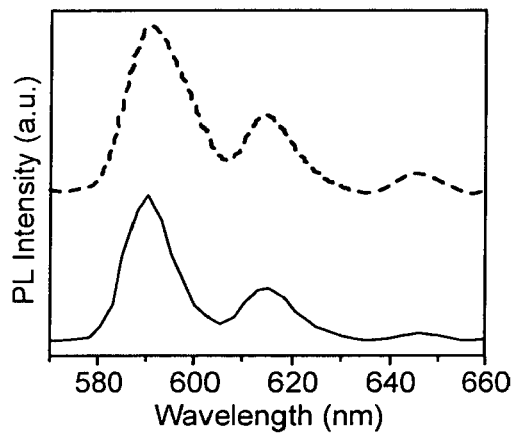
FIG. 19. Photoluminescence spectra of as-prepared alkaline earth metal fluoride nanowires (red curves) as well as of bulk samples generated from direct mixing of commercially available precursor solutions (black curves). All samples were doped with $Eu^{3+}$ and $Tb^{3+}$, respectively, in independent runs. (A) $CaF_2$ doped with $Eu^{3+}$; (B) $CaF_2$ doped with $Tb^{3+}$; (C) $SrF_2$ doped with $Eu^{3+}$; (D) $SrF_2$ doped with $Tb^{3+}$; (E) $BaF_2$ doped with $Eu^{3+}$; (F) $BaF_2$ doped with $Tb^{3+}$.
Figure 19B:
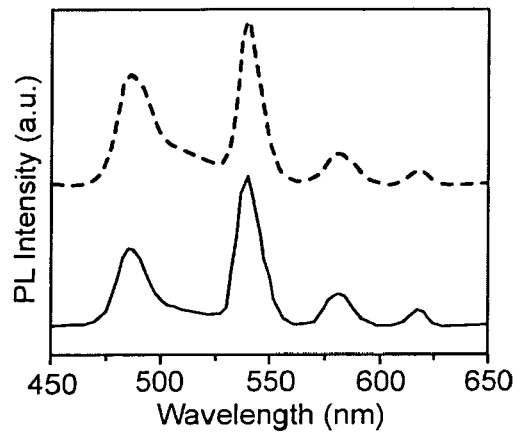
Figure 19C:
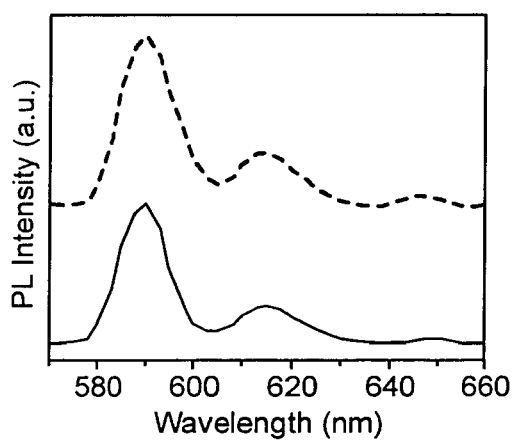
Figure 19D:
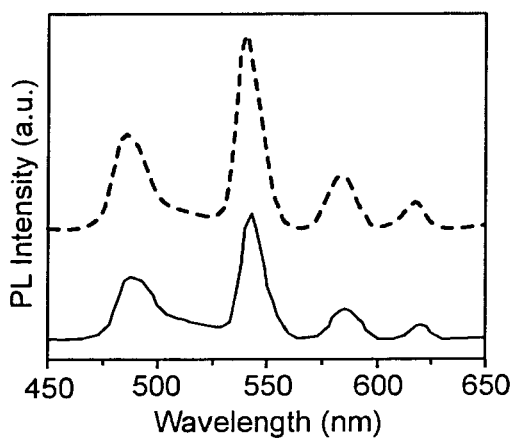
Figure 19E:
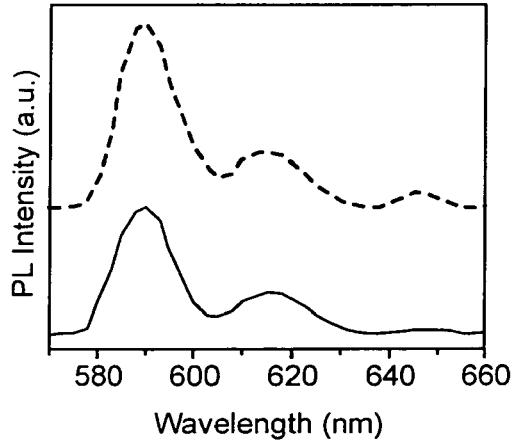
Figure 19F:
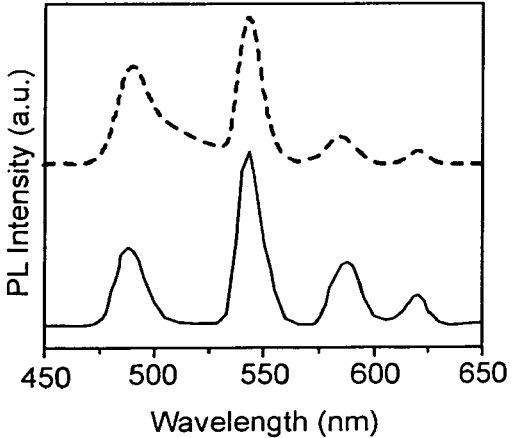

As previously mentioned, bulk alkaline earth metal fluoride crystals doped with rare earth metal ions display unique luminescence properties.(L. F. Johnson, et al. *Appl. Phys. Lett.* 1971, 19, 44; X. X. Zhang, et al. *Phys. Rev. B* 1995, 51, 9298; and P. Xie, et al. *Opt. Lett.* 1992, 17, 1198.) As a demonstration of principle, as-prepared alkaline earth metal fluoride nanowire samples, doped with either Eu$^{3+}$ and Tb$^{3+}$, displayed either pink or green luminescence, respectively, under UV lamp excitation (FIG. 18). FIG. 19 shows the corresponding photoluminescence spectra of lanthanide-doped alkaline earth metal fluoride nanowires. The major peak at 591 nm in Eu-doped alkaline earth metal fluoride nanowires has been attributed to the $^5D_0 \rightarrow ^7F_1$ emission peak, characteristic of Eu$^{3+}$ ions surrounded by fluoride ions; the peak at 614 nm can be plausibly ascribed to a $^5D_0 \rightarrow ^7F_2$ electric-dipole transition, similarly sensitive to small changes in the chemical environment as well as to symmetry considerations surrounding the Eu$^{+3}$ ions.(T. Chatterjee, et al. *Appl. Phys. Lett.* 1997, 71, 3610; D. Pi, et al. *Spectrochim. Acta A*, 2005, 61, 2455; C. Cannas, et al. *J. Mater. Chem.*, 2003, 13, 3079.) By analogy, the four well-resolved peaks, positioned at 489 nm, 542 nm, 584 nm, and 620 nm, respectively, that have been observed for Tb-doped alkaline earth metal fluoride nanowires, likely correspond to ligand-sensitized emission of the Tb$^{+3}$ ions, specifically electronic transitions corresponding to $^5D_4 \rightarrow ^7F_J$ (J=6, 5, 4, 3). (J. C. Pivin, et al. *J Alloys Compd.* 2002, 341, 272; and P. Liu, et al. *Macromolecules*, 2002, 35, 1487) Results on the nanowires agreed favorably with comparable measurements taken on analogous bulk samples (FIG. 19).

The present invention enables the synthesis of a family of single-crystalline alkaline earth metal fluoride nanowires (in addition to their rare-earth ion-doped analogues) of varying controllable sizes using a modified template-directed methodology. It is noteworthy that single-crystalline, alkaline earth metal fluoride nanowires can be produced very readily using this modified, room-temperature, template-assisted method, without the use of either sophisticated experimental setups or high-temperature annealing. Moreover, the diameters of the as-fabricated nanowires could be controlled by choosing polycarbonate membranes with predictable pore sizes. Resulting nanowires have been extensively characterized by microscopy and spectroscopy data. The approach is quite general and can be applied to the synthesis of other important nanomaterials, including but not limited to $SrWO_4$, $BaMoO_4$, $ZnWO_4$, $BaSO_4$, and $BaIO_4$ as well as $Ba_{1-x}Sr_xWO_4$. The luminescent properties of as-doped metal fluoride nanowires provide the basis for a more thorough investigation of their optical and optoelectronic properties for possible incorporation into nanoscale devices.

Although preferred embodiments of the present invention have been described herein with reference to the accompanying drawings, it is to be understood that the invention is not limited to those precise embodiments and that various other changes and modifications may be effected herein by one skilled in the art without departing from the scope or spirit of the invention, and that it is intended to claim all such changes and modifications that fall within the scope of the invention.

The invention claimed is:

1. A single-crystalline nanorod having the formula $ABO_4$, wherein A is selected from the group consisting of Ba, Sr, Pb, Ca, Fe, Mn, Co, Ni, Cu, Zn, Mg, and mixtures thereof and B is selected from the group consisting of W, Cr, Mo, S, I, Se, and mixtures thereof wherein the nanorod is at least about 80% free of defects and/or dislocations, and wherein the nanorod is free of surfactant molecular groups, and wherein the nanorod is isolated.

2. The single-crystalline nanorod of claim 1, wherein the nanorod is at least about 95% free of defects and/or dislocations.

3. The single-crystalline nanorod of claim 1 wherein the nanorod has an aspect ratio of about 2 to about 1000.

4. The single-crystalline nanorod of claim 1 wherein the nanorod has a diameter of about 2 nm to about 2 µm.

5. The single-crystalline nanorod of claim 1 wherein the nanorod has a length of about 20 nm to about 20 µm.

6. The single-crystalline nanorod of claim 1 wherein the nanorod consists essentially of $BaWO_4$ or $BaCrO_4$.

7. The single-crystalline nanorod of claim 1 wherein the A is $Ba_{1-x}Sr_x$ wherein x is $0 \leq x \leq 1$.

8. The single-crystalline nanorod of claim 1 wherein the B is $W_{1-x}Cr_x$ wherein x is $0 \leq x \leq 1$.

9. A nanoarray comprising a plurality of single crystalline nanorods wherein the chemical formula of the nanorods is $ABO_4$, wherein A is selected from the group consisting of Ba, Sr, Pb, Ca, Fe, Mn, Go, Ni, Cu, Zn, Cd, Mg, and mixtures thereof; and B is selected from the group consisting of W, Cr, Mo, S, I, Se, and mixtures thereof, wherein the nanorods are at least about 80% free of defects and/or dislocations, wherein the nanorods are free of surfactant molecular groups, and wherein the nanoarray is at least 50% monodisperse.

10. A method of producing single crystalline nanorods with the chemical formula of $ABO_4$, the method comprising:

providing a first reagent solution comprising a salt of A, and providing a second reagent solution comprising a salt of B;

placing a porous membrane between the first reagent solution and the second reagent solution, wherein A is selected from the group consisting of Ba, Sr, Pb, Ca, Fe, Mn, Co, Ni, Cu, Zn, Cd, Mg, and mixtures of thereof; and B is selected from the group consisting of W, Cr, Mo, S, I, Se, and mixtures thereof, thereby producing single crystalline nanorods, wherein the nanorods are at least about 80% free of defects and/or dislocations.

11. The method of claim 10 wherein the production takes place at room temperature.

12. The method of claim 10 wherein the porous membrane is a "track-etch" polymeric membrane, a copolymer template, a porous alumina membrane, a porous silica membrane or a TELFON® membrane.

13. The method of claim 10 comprising a double-diffusion set-up.

14. The method of claim 10 wherein the method further comprises controlling the dimensions and morphology of the nanorods.

15. A device comprising at least one single crystalline Nanorod, wherein the single-crystalline nanorod has the formula $ABO_4$, wherein A is selected from the group consisting of Ba, Sr, Pb, Ca, Fe, Mn, Co, Ni, Cu, Zn, Cd, Mg, and mixtures thereof; and B is selected from the group consisting of W, Cr, Mo, S, I, Se, and mixtures thereof, and wherein the nanorod is virtually completely free of defects and/or dislocations, wherein the nanorod is free of surfactant molecular groups, and wherein the nanorod is isolated, wherein the device is selected from the group consisting of sensors, a device used in molecular electronics, a device used in optoelectronics, and scanning probe microscopy tips.

16. A single-crystalline nanorod having the formula $ABO_4$, wherein A is selected from the group consisting of Ba, Sr, Pb, Ca, Fe, Mn, Co, Ni, Cu, Zn, Cd, Mg, and mixtures thereof; and B is selected from the group consisting of Cr, Mo, S, I, Se, and mixtures thereof, wherein the nanorod is at least about 80% free of defects and/or dislocations, wherein the nanorod is free of surfactant molecular groups, and wherein the nanorod is isolated.

17. The single-crystalline nanorod of claim 16, wherein the nanorod is at least about 95% free of defects and/or dislocations.

18. The single-crystalline nanorod of claim 16 wherein the nanorod has an aspect ratio of about 2 to about 1000.

19. The single-crystalline nanorod of claim 16 wherein the nanorod has a diameter of about 2 nm to about 2 µm.

20. The single-crystalline nanorod of claim 16 wherein the nanorod has a length of about 20 nm to about 20 µm.

* * * * *

UNITED STATES PATENT AND TRADEMARK OFFICE
CERTIFICATE OF CORRECTION

PATENT NO. : 7,575,735 B2  Page 1 of 1
APPLICATION NO. : 11/592704
DATED : August 18, 2009
INVENTOR(S) : Wong et al.

It is certified that error appears in the above-identified patent and that said Letters Patent is hereby corrected as shown below:

Column 18, line 59:

Now reads: "with pore sizes as small as 50nnm"

Should read: --with pore sizes as small as 50 nm--

Signed and Sealed this

Twenty-third Day of February, 2010

David J. Kappos
*Director of the United States Patent and Trademark Office*